(12) United States Patent
Chen

(10) Patent No.: US 8,692,379 B2
(45) Date of Patent: Apr. 8, 2014

(54) INTEGRATED CIRCUIT CONNECTOR ACCESS REGION

(75) Inventor: Shih-Hung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/594,372

(22) Filed: Aug. 24, 2012

(65) Prior Publication Data
US 2014/0054784 A1 Feb. 27, 2014

(51) Int. Cl.
*H01L 23/50* (2006.01)

(52) U.S. Cl.
USPC ............ 257/773; 257/E23.169; 257/207; 257/208; 257/211; 257/246; 257/247; 257/248; 257/758; 257/759; 257/760; 257/776; 257/907

(58) Field of Classification Search
USPC ......... 257/773, 207, 208, 211, 246, 247, 248, 257/758, 759, 760, 776, 907, E23.169, 700, 257/701
See application file for complete search history.

(56) References Cited

U.S. PATENT DOCUMENTS

| 7,423,300 | B2 * | 9/2008 | Lung et al. ............... 257/207 |
| 8,383,512 | B2 * | 2/2013 | Chen et al. ............... 438/637 |
| 2012/0181701 | A1 | 7/2012 | Chen et al. | |

| 2012/0184097 | A1 | 7/2012 | Chen et al. | |
| 2013/0119455 | A1 * | 5/2013 | Chen et al. ............. 257/324 |
| 2013/0175598 | A1 * | 7/2013 | Chen et al. ............. 257/324 |

OTHER PUBLICATIONS

U.S. Appl. No. 13/451,428 by Chen et al., filed Apr. 19, 2012, entitled "Integrated Circuit Capacitor and Method."

* cited by examiner

*Primary Examiner* — Alexander Oscar Williams
(74) *Attorney, Agent, or Firm* — James F. Hann; Haynes Beffel & Wolfeld LLP

(57) ABSTRACT

A connector access region of an integrated circuit device includes a set of parallel conductors, extending in a first direction, and interlayer connectors. The conductors comprise a set of electrically conductive contact areas on different conductors which define a contact plane with the conductors extending below the contact plane. A set of the contact areas define a line at an oblique angle, such as less than 45° or 5° to 27°, to the first direction. The interlayer connectors are in electrical contact with the contact areas and extend above the contact plane. At least some of the interlayer connectors overlie but are electrically isolated from the electrical conductors adjacent to the contact areas with which the interlayer connectors are in electrical contact. The set of parallel conductors may include a set of electrically conductive layers with the contact plane being generally perpendicular to the electrically conductive layers.

9 Claims, 26 Drawing Sheets

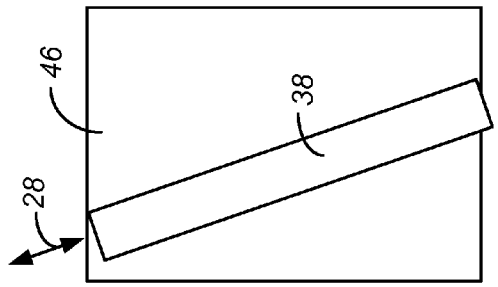
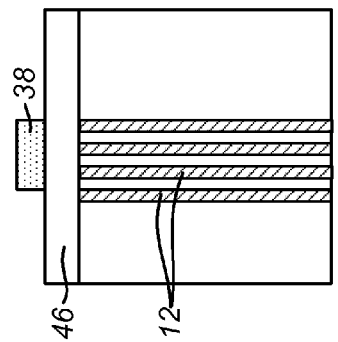
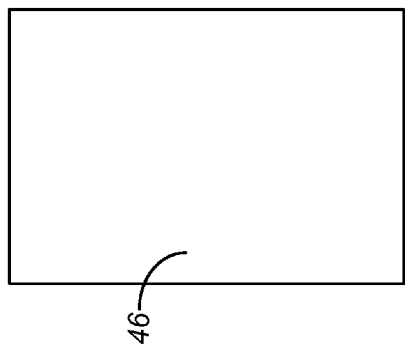
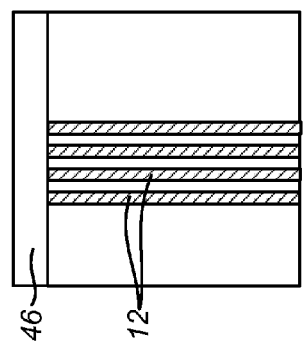
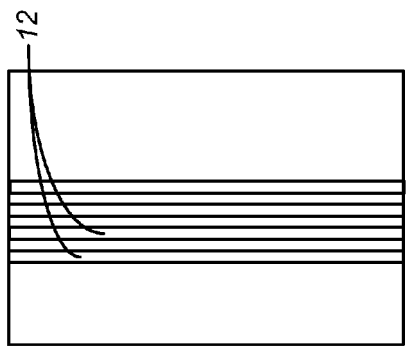
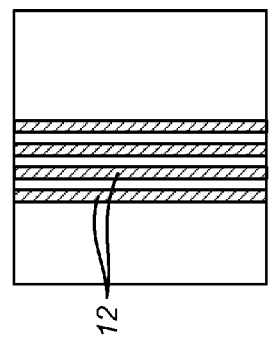

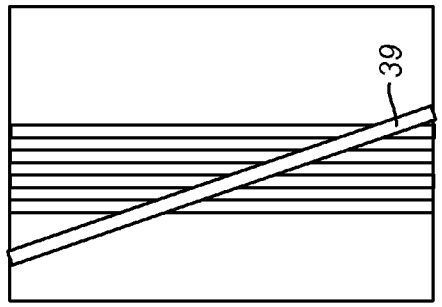
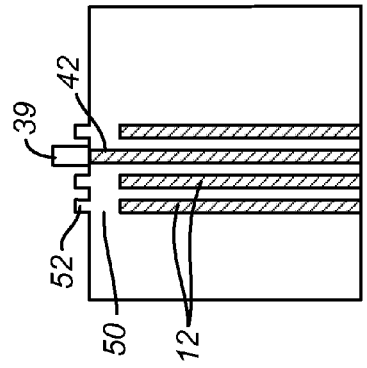
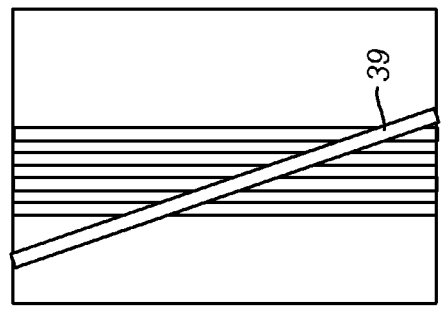
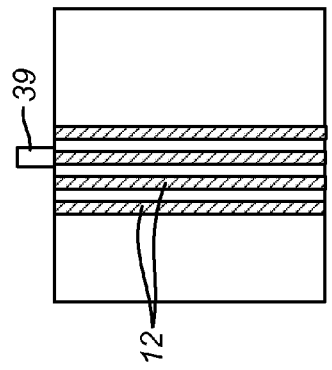
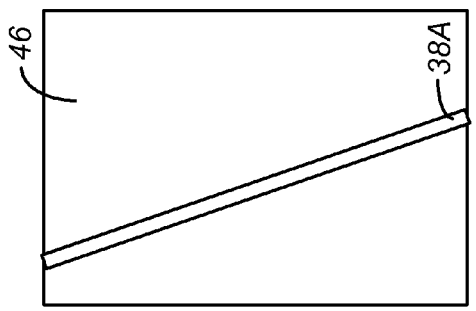
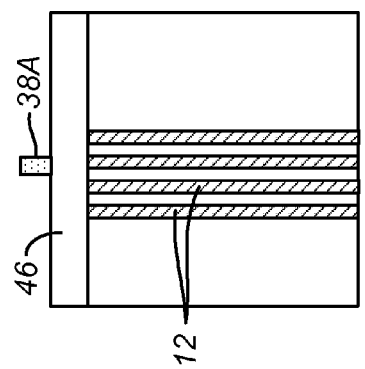

INTEGRATED CIRCUIT CONNECTOR ACCESS REGION

BACKGROUND OF THE INVENTION

1. Field of the Invention

The present invention relates to photolithography techniques and photolithographic masks and methods for fabricating such masks.

2. Description of Related Art

Dimensions of integrated circuits continue to become smaller in order to fit more circuitry in a given area. Multilayer integrated circuits have had the width of the electrically conductive layers in a set of parallel electrically conductive layers, as well as the width of the dielectric layers separating the electrically conductive layers, reduced. However, the lateral dimensions or diameters for the interlayer connectors, including plugs and vias, which contact the individual electrically conductive layers, is often large enough so that the possibility of a single interlayer connector contacting two adjacent electrically conductive layers has become a problem. While various schemes have been devised in response to this issue, none are ideal for all circumstances. See, for example, the following co-pending U.S. patent application Ser. No. 13/049,303, filed 16 Mar. 2011, entitled REDUCED NUMBER OF MASK FOR IC DEVICE WITH STACKED CONTACT LEVELS; and Ser. No. 13/114,931, filed 24 May 2011, entitled MULTILAYER CONNECTION STRUCTURE AND MAKING METHOD, now U.S. Pat. No. 8,383,512.

SUMMARY OF THE INVENTION

With the various examples discussed below, if an interlayer connector in contact with a particular contact area of an electrically conductive layer is sized and/or positioned such that it overlies a portion of an adjacent electrically conductive layer, there is no harm done because that portion of the adjacent electrically conductive layer is not electrically conductive.

A connector access region of an integrated circuit device includes a set of parallel conductors and interlayer connectors. The set of parallel conductors extend in a first direction. The conductors comprise a set of electrically conductive contact areas on different conductors. The contact areas define a contact plane with the conductors extending below the contact plane. A set of the contact areas define a line at an oblique angle to the first direction. The interlayer connectors are in electrical contact with the contact areas and extend above the contact plane. At least some of the interlayer connectors overlie but are electrically isolated from the electrical conductors adjacent to the contact areas with which the interlayer connectors are in electrical contact.

In some examples of the connector access region, the set of parallel conductors comprises a set of electrically conductive layers and the contact plane is generally perpendicular to the electrically conductive layers. In some examples, the electrically conductive layers have upper edges generally aligned with the contact plane, and an electrically insulating material covers said upper edges with the exception of the contact areas. In some examples, the electrically conductive layers have stepped upper edges, the stepped upper edges including the contact areas and recessed regions spaced apart below the contact plane, with electrically insulating material covering the recessed regions. In some examples, the oblique angle is less than 45°, and can be 5° to 27°. In some examples, the contact areas are longer in the first direction than in a transverse direction perpendicular to the first direction and parallel to the contact plane.

A method, for use with an integrated circuit device including a connector access region comprising a set of parallel conductors extending in a first direction, is used to create interlayer connectors in electrical contact with the conductors. Electrically conductive contact areas are formed on different ones of the conductors, the contact areas defining a contact plane, the conductors extending below the contact plane. The forming step comprises orienting the set of contact areas along a line at an oblique angle to the first direction. Interlayer connectors are created to be in electrical contact with the contact areas, the interlayer connectors extending above the contact plane. At least some of the interlayer connectors overlie electrical conductors adjacent to the contact areas with which said interlayer connectors are in electrical contact; however, such overlying interlayer connectors are electrically isolated from the adjacent electrical conductors.

In some examples, the forming step includes masking a portion of the connector access region along the line, and etching those portions of the conductors not masked. In some examples, the forming step includes masking a portion of the connector access region along the line, and oxidizing those portions of the conductors not masked. In some examples, the forming step comprises orienting the set of contact areas along a line at an oblique angle of less than 45° to the first direction while in other examples, the forming step comprises orienting the set of contact areas along a line at an oblique angle of 5° to 27° to the first direction. In some examples, the forming step is carried out to create contact areas which are longer in the first direction than in a transverse direction perpendicular to the first direction and parallel to the contact plane.

In other examples, the forming step further comprises depositing a first dielectric layer over the connector access region to cover the contact plane, depositing a second dielectric layer on the first dielectric layer, creating a first set of trenches passing completely through the second dielectric layer and partly through the first dielectric layer so that the first set of trenches have bottoms spaced apart above the contact plane, the first set of trenches oriented in a second direction transverse to the first direction, and creating a second, interrupted trench in the first dielectric layer, but not through the second dielectric layer, along the line in a manner to intersect the first of trenches and expose said contact areas. The second dielectric layer depositing step may be carried out using a material creating hard mask as the second dielectric layer.

Other aspects and advantages of the present invention can be seen on review of the drawings, the detailed description and the claims, which follow.

BRIEF DESCRIPTION OF THE DRAWINGS

FIG. 5 shows a connector access region of an IC device with a photoresist mask formed on the upper surface of the connector access region along a line oriented at an acute angle to the direction of the electrically conductive layers.

FIG. 6 shows the structure of FIG. 5A after etching portions of the electrically conductive layers not covered by the mask to create trenches.

FIG. 7 shows the structure of FIG. 6A after deposition of an etch stop material filling the trenches and covering the upper surface of the etched structure.

FIGS. 7A-8A show additional deposition, patterning and etching steps applied to the structure of FIG. 7 to create the structure of FIGS. 8 and 8A with interlayer connectors electrically connected to selected electrically conductive layers through extensions of the electrically conductive layers.

FIGS. 9A-11 illustrate an alternative to the example of FIGS. 5-8A.

FIGS. 9A-9U show a sequence of steps in which the photoresist mask material of FIG. 5 is replaced with a dielectric mask material, followed by oxidizing the resulting structure. As a result the upper portions of the exposed electrically conductive layers oxidize and become electrically nonconducting thus effectively reducing their height as shown in FIG. 9L. This is followed by the formation of interlayer conductors in contact with the extensions of the electrically conductive layers FIGS. 10A-11 show the structure resulting from the steps of FIGS. 9A-9U.

FIGS. 12-22 illustrate another method for creating interlayer connectors in contact with electrically conductive layers.

FIG. 12 illustrates the connector access region of an IC device of FIG. 5, but without the photoresist patterned mask, after deposition of an isolation layer including a lower dielectric layer and an upper hard mask layer.

FIG. 13 is a top plan view of the structure of FIG. 12 after creating a patterned photoresist layer on the hard mask layer defining a series of first gaps oriented perpendicular to the direction of the electrically conductive layers.

FIG. 14 is a three-dimensional view of the structure of FIGS. 13A and 13B after removal of the patterned photoresist layer.

FIGS. 15 and 15A are three-dimensional and top plan views of the structure of FIG. 14 showing a second patterned photoresist layer on the hard mask layer defining a second gap. As in FIG. 5, the second gap is oriented at an acute angle to the direction of the electrically conductive layers and thus passes over a number of the first gaps.

FIGS. 17 and 17A are enlarged partial top plan views illustrating the shape of an example of a contact area at the upper end of an electrically conductive layer.

FIGS. 18, 18A and 18B are a top plan view and two cross-sectional views, the cross-sectional views taken along lines 18A-18A and 18B-18B, after removal of the second patterned photoresist layer and the deposition of an electrically conductive material onto the structure.

FIG. 20 shows the structure of FIG. 19A after an optional chemical mechanical polishing step to remove the hard mask layer.

FIG. 21 is a three-dimensional view of the structure of FIG. 20 but with interlayer dielectric material surrounding the extensions of the electrically conductive layers and separating the interlayer connectors removed to show detail.

FIG. 22 shows the structure of FIG. 21 but with removal of the interlayer conductors to show the positions and orientations of the extensions of the electrically conductive layers.

DETAILED DESCRIPTION

Figure 1:
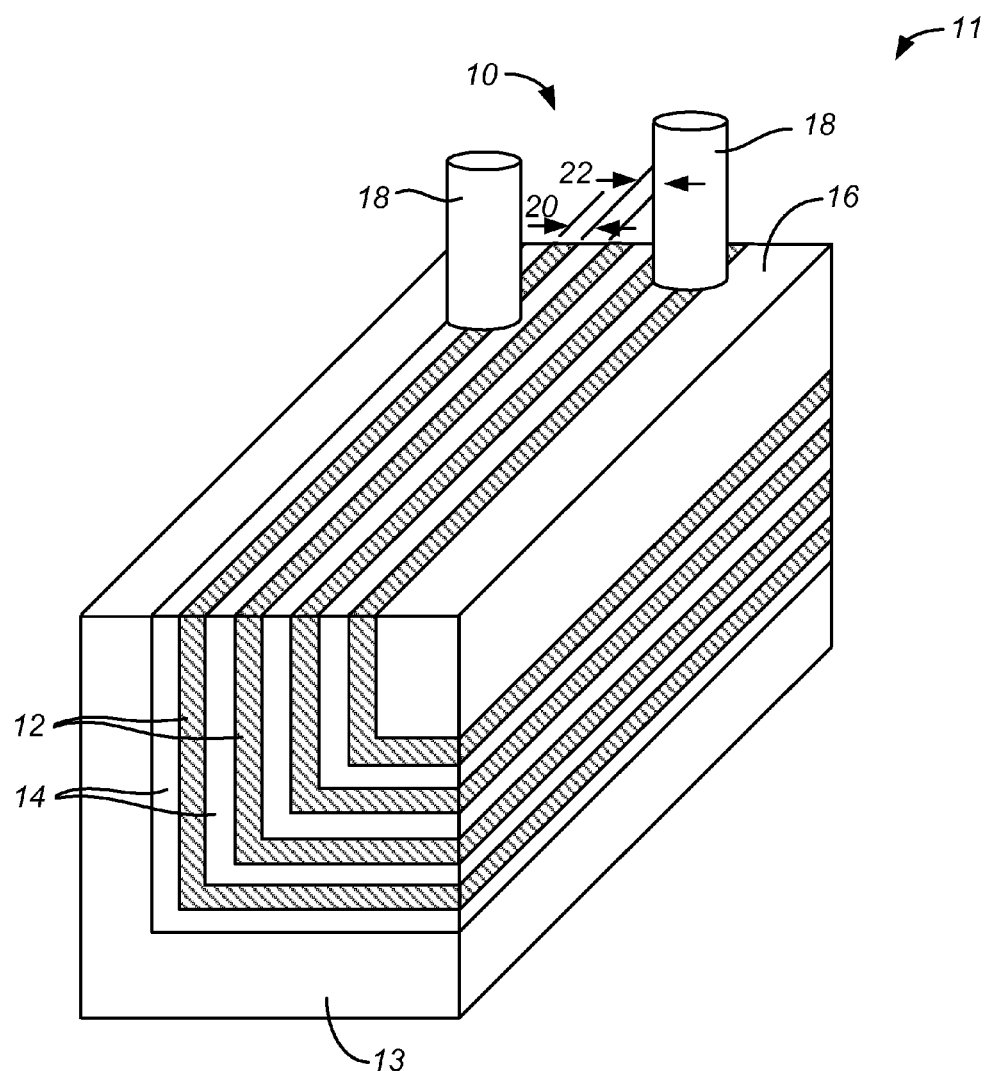
FIG. 1 is a simplified three-dimensional diagram of a portion of a prior art integrated circuit (IC) device showing how, due to the lateral size or misplacement, or both, of the interlayer connectors, the interlayer connectors may be electrically connected to adjacent electrically conductive layers.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a simplified three-dimensional diagram of a connector access region 10 of a generally conventional integrated circuit (IC) device 11, including a substrate 13 and a set of parallel electrically conductive layers 12 separated by dielectric layers 14 on the substrate. The electrically conductive layers 12 and dielectric layers 14 extend to an upper surface 16 of connector access region 10 of IC device 11. Also illustrated are interlayer connectors 18 contacting the electrically conductive layers 12 at upper surface 16 of IC device 11. While the width 20 of electrically conductive layers 12 and the width 22 of dielectric layers 14 have continued to be reduced for greater density, for various reasons the lateral size of interlayer connectors, including vias and plugs, have not been reduced to the same degree. Because of the relatively large lateral size of interlayer connectors 18 compared to the width 20 of electrically conductive layers 12 and the width 22 of dielectric layers 14, or due to the misplacement of interlayer connectors 18, and sometimes for both reasons, the interlayer connectors 18 may be improperly electrically connected to adjacent electrically conductive layers 12. The various examples discussed below address this problem.

Figure 2:
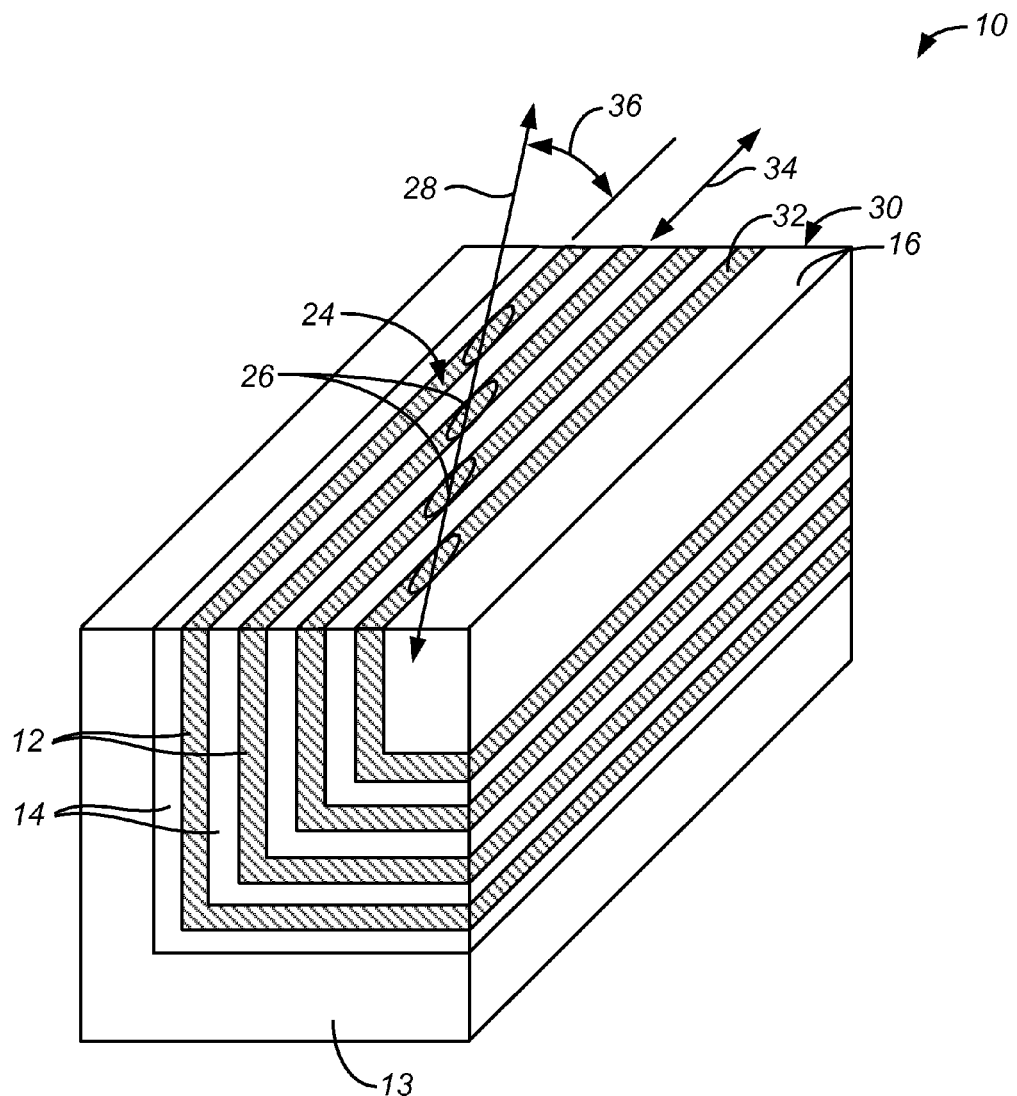
FIG. 2 is a view similar to that of FIG. 1 illustrating the concept of providing a line of electrically conductive contact areas, the line of contact areas defining a contact plane, the remainder of the electrically conductive layers at the contact plane being nonconductive.
Figure 3:
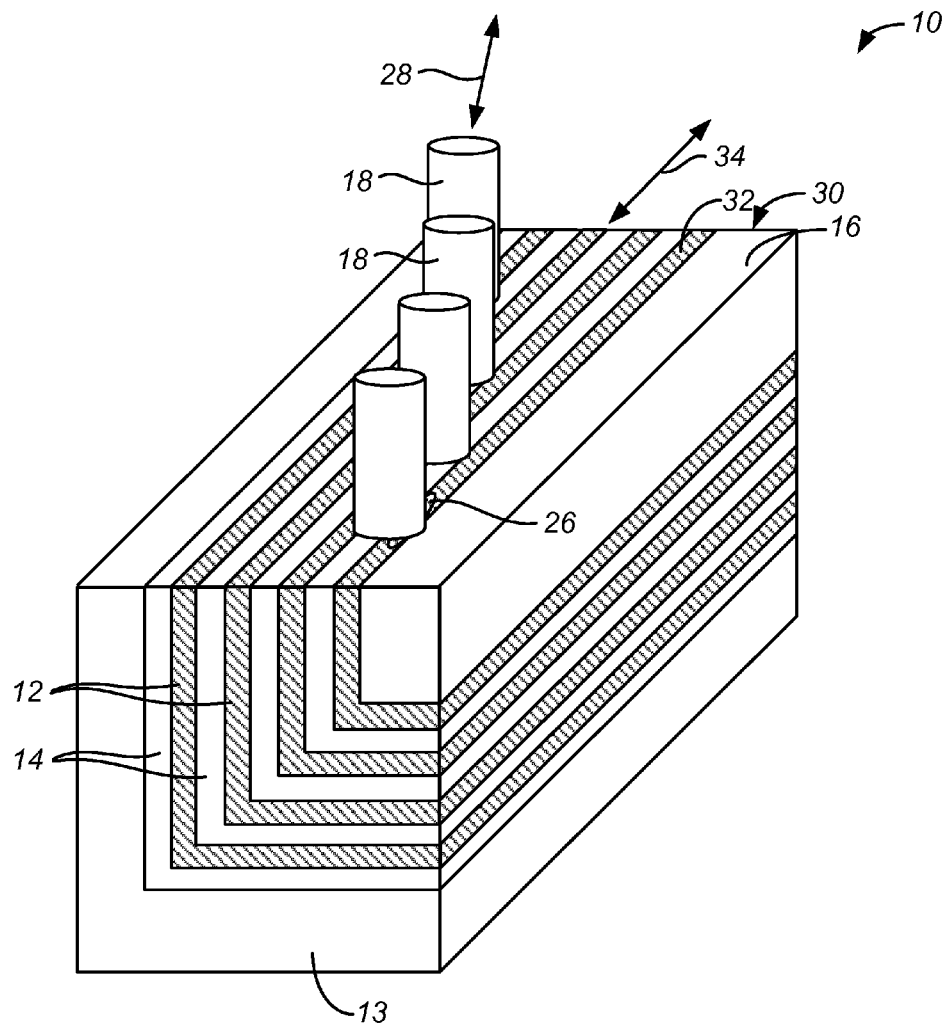
FIG. 3 illustrates the structure of FIG. 2 with a series of interlayer connectors extending from the contact areas and oriented generally perpendicular to the contact plane.
Figure 4:
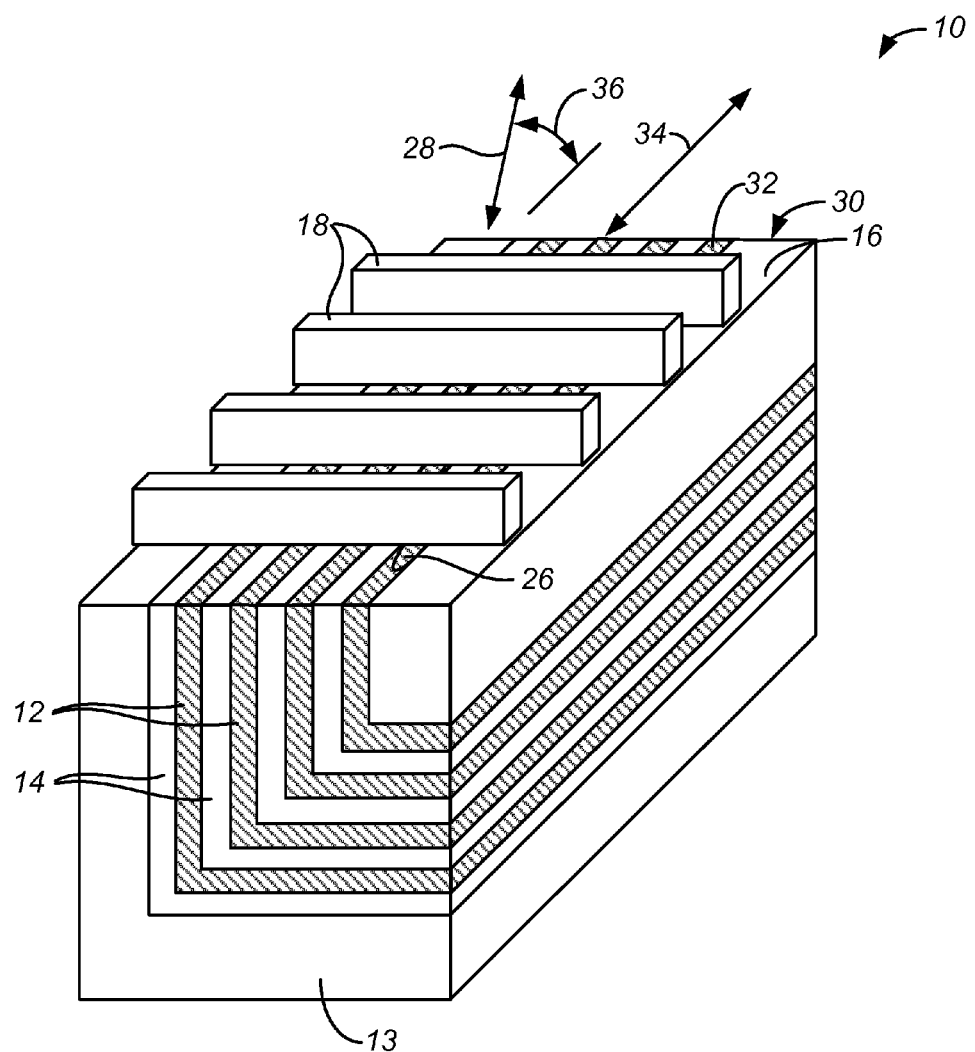
FIG. 4 illustrates the structure of FIG. 2 in which the interlayer connectors are arranged to contact the contact areas and extend generally parallel to the contact plane.

FIGS. 2-4 are examples illustrating the basic concept of the invention.

FIG. 2 is a view similar to that of FIG. 1 illustrating the concept of providing a set 24 of electrically conductive contact areas 26 on different electrically conductive layers 12 extending along a line 28. Electrically conductive layers 12 have upper surfaces 32 at upper surface 16 of connector access region 10. The set 24 of contact areas 26 define a contact plane 30 along upper surface 16. Contact plane 30 is oriented generally perpendicular to electrically conductive layers 12. Except for contact areas 26, the remainder of the upper surfaces 32 of electrically conductive layers 12 at contact plane 30 is made to be electrically nonconductive. Electrically conductive layers 12 at upper surfaces 32 extend in a first direction 34. Line 28 extends transversely to the first direction 34, preferably at an oblique angle 36 to first dimension 34, preferably at an oblique angle of less than 45°, and more preferably at an oblique angle between 0.1° and 45°, and even more preferably at an oblique angle 36 of 5° to 27°, to first dimension 34. The appropriate angle 36 will be significantly influenced by the pitch of electrically conductive layers 12, measured perpendicular to a first direction 34, and the pitch of interlayer conductors 18, measured parallel to first direction 34. Typical materials for interlayer connectors 18 include doped Si, TiN, W, TaN, Ti, Ta, and others. Typical materials for dielectric layers 14 includes $SiO_2$, SiN, $HfO_x$, AlO, and other high k materials. Typical materials for electrically conductive layers 12 include Cu, W, Al, heavily doped polysilicon, and others.

FIG. 3 illustrates the structure of FIG. 2 with a series of interlayer connectors 18 electrically connected to and extending generally vertically from contact areas 26 and generally perpendicular to contact plane 30. The limited size of contact areas 26 and the orientation of line 28 at angle 36 causes contact areas 26 to be laterally offset from one another. Therefore, if an interlayer connector 18 in contact with a particular contact area 26 is sized and/or positioned such that it overlies a portion of the upper surface 32 of an adjacent electrically conductive layer 12, there is no harm done because, with the exception of contact areas 26, upper surfaces 32 are not electrically conductive.

FIG. 4 illustrates the structure of FIG. 2 in which the interlayer connectors 18 are arranged to contact the contact areas 26 and extend generally perpendicular to first direction 34 and parallel to contact plane 30. Again, each interlayer connector 18 only makes electrical contact with the desired number of electrically conductive layers 12, in this example one, by virtue of the limited size of contact areas 26, the limited width of interlayer connectors 18, and the choice of angle 36 to keep the contact areas laterally offset from one another.

FIGS. 5-8 illustrate a first method for creating interlayer connectors 18 in contact with electrically conductive layers 12.

Figure 5:
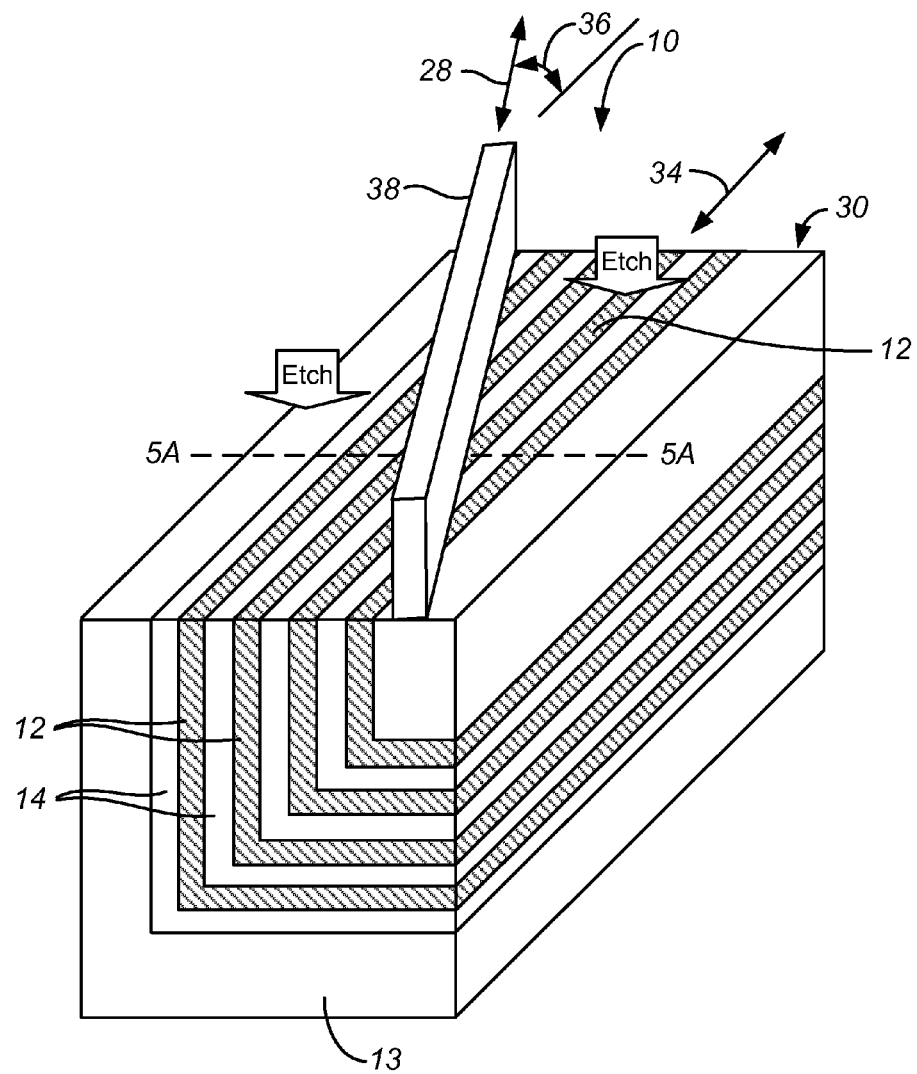
FIGS. 5-8A illustrate a first method for creating interlayer connectors in contact with electrically conductive layers.
Figure 5A:
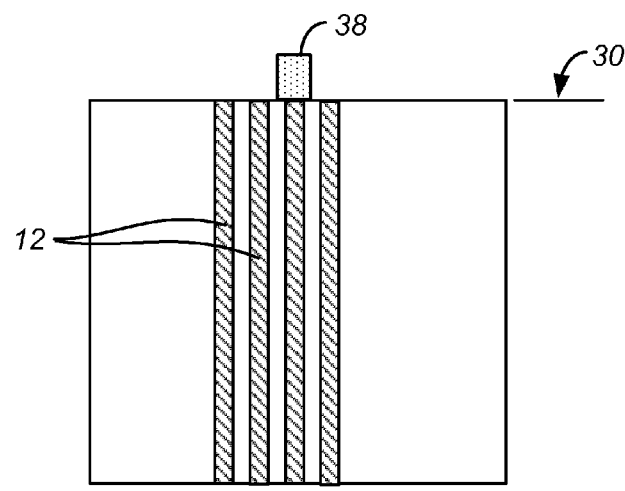
FIG. 5A is a simplified cross-sectional view taken along line 5A-5A of FIG. 5 showing how the mask overlies a single interlayer connector at that location along the mask.

FIG. 5 shows connector access region 10 of IC device 11 with a photoresist patterned mask 38 formed on the upper surface 16 of the connector access region 10 along line 28 oriented at an acute angle 36 to the direction 34 of the upper surfaces 32 of electrically conductive layers 12. Mask 38 overlies portions of the upper surface 32 of electrically conductive layers 12 corresponding to contact areas 26 of FIGS. 2-4. FIG. 5A is a simplified, reduced scale, cross-sectional view taken along line 5A-5A of FIG. 5 showing how mask 38 overlies a single electrically conductive layer 12 at that location along the mask.

Figure 6:
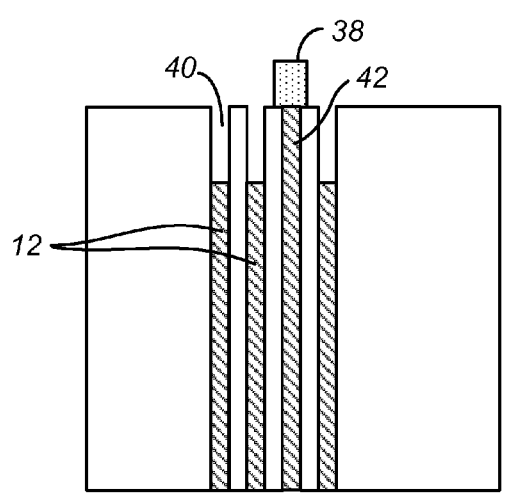
Figure 6A:
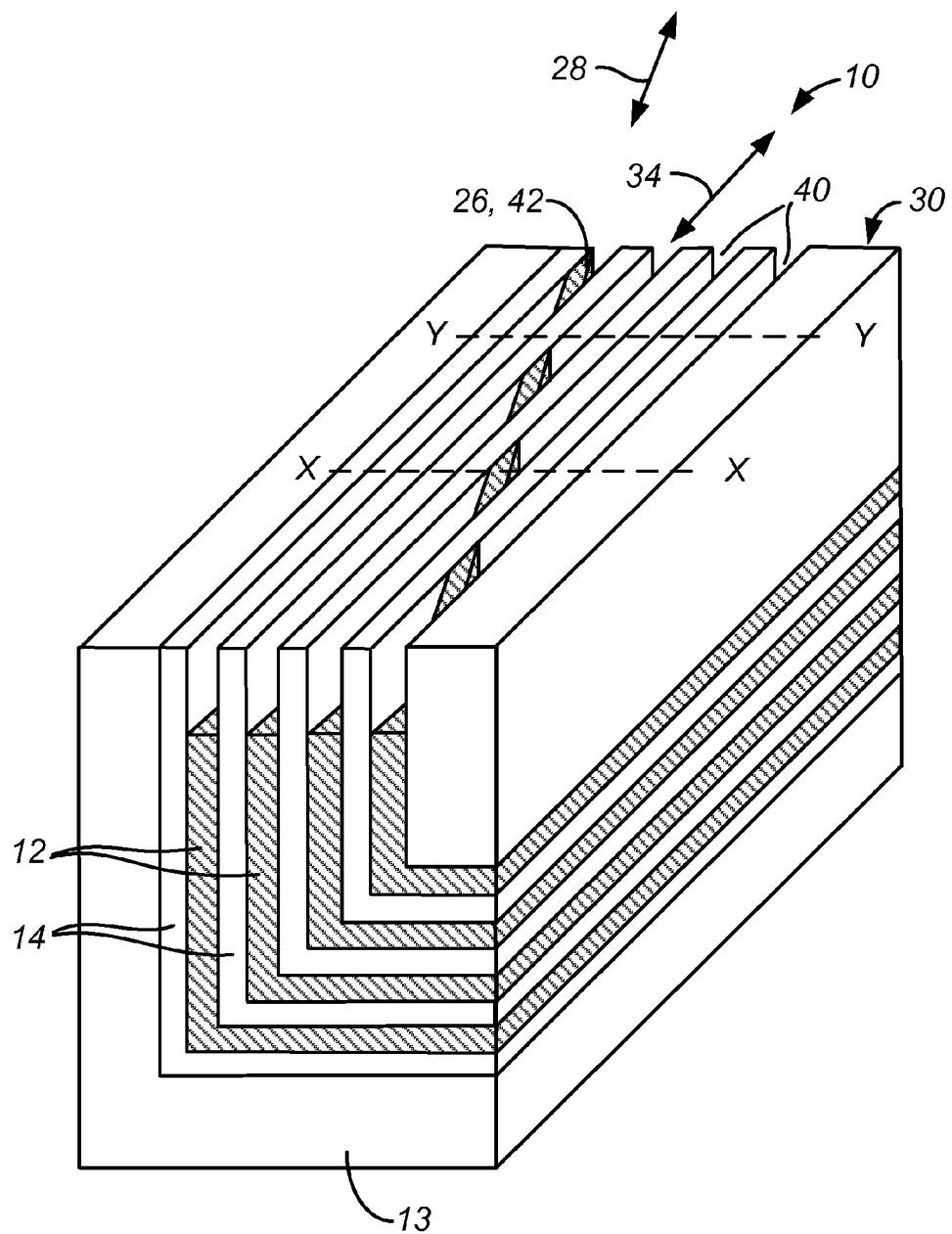
FIG. 6A is a three-dimensional view of the structure of FIG. 6 after removal of the mask showing the extensions of the electrically conductive layers within the trenches.

FIG. 6 shows the structure of FIG. 5A after etching portions of the electrically conductive layers 12 not covered by mask 38 but before removal of the mask. The etching of those portions of electrically conductive layers 12 not covered by mask 38 causes such portions to be recessed below contact plane 30 to create trenches 40. FIG. 6A is a three-dimensional view of the structure of FIG. 6 after removal of mask 38. What can be seen are extensions 42 of conductive layers 12 passing through trenches 40 and having a generally parallelogram-shaped contact areas 26 at the upper ends aligned with contact plane 30. Contact areas 26 have lengths in first direction 34 which are longer than their widths measured in a transverse direction perpendicular to their lengths. Contact areas 26 will not be true regular polygons but will, for example, typically have rounded corners and sides which are not completely straight due to manufacturing variabilities and constraints.

Figure 7:
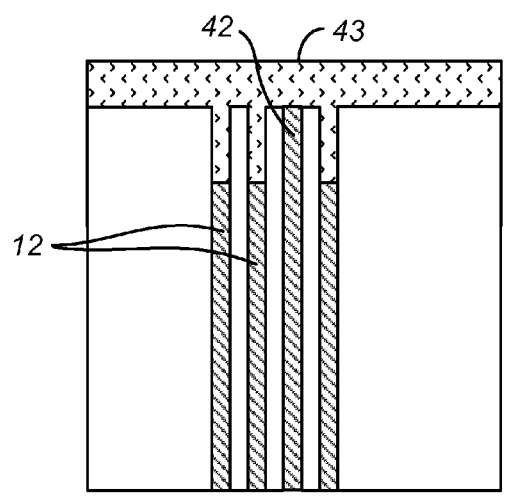
Figure 7A:
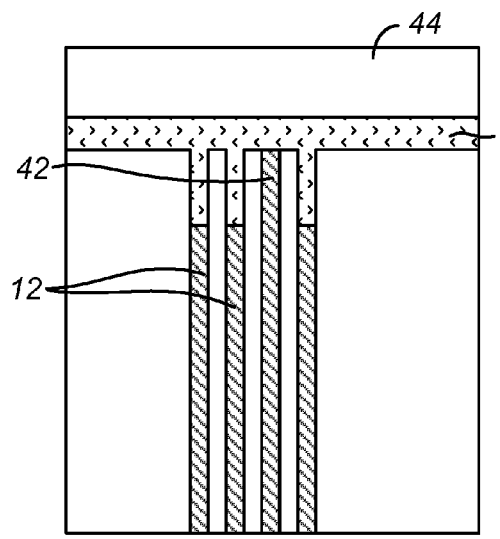
Figure 7B:
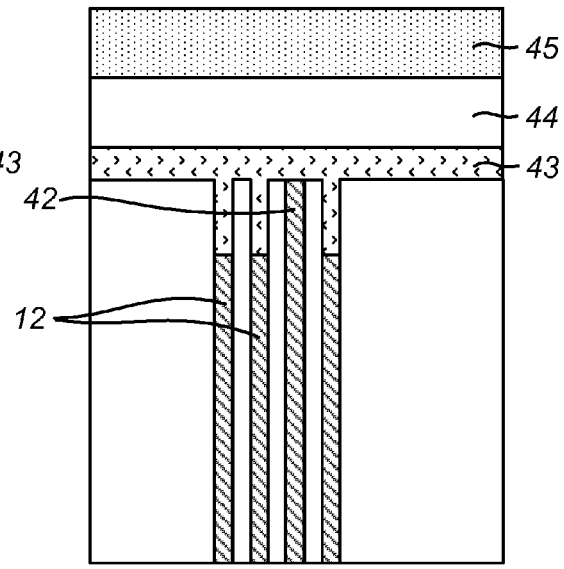
Figure 7C:
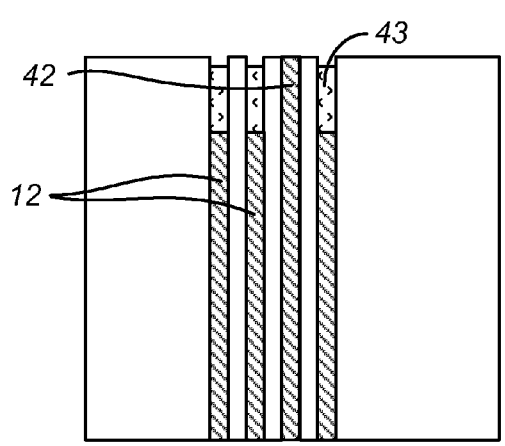
Figure 8A:
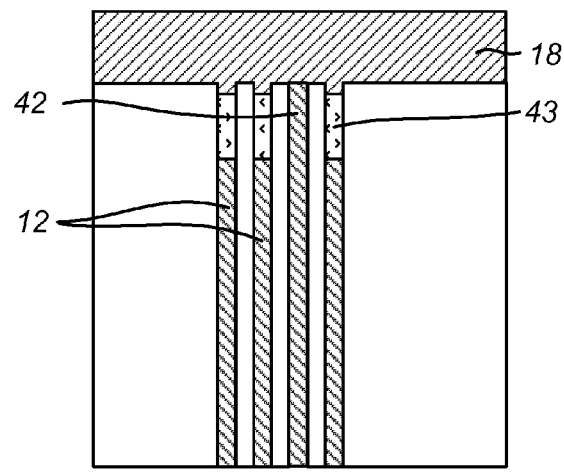
Figure 8:
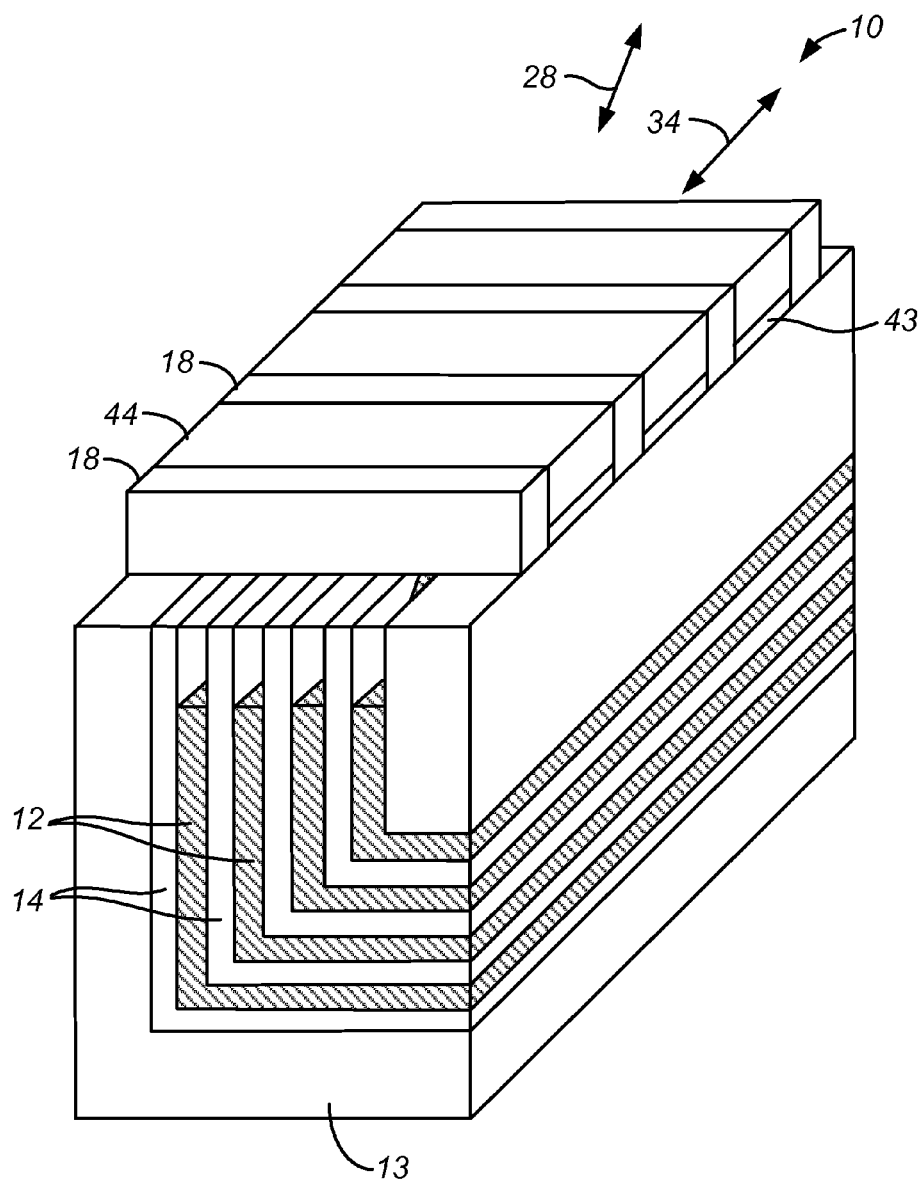

FIG. 7, taken along line X-X of FIG. 6A, shows the structure of FIG. 6A after deposition of an etch stop material 43, such as silicon nitride SiN, filling the trenches 40 and covering the upper surface 16 of connector access region 10. FIG. 7A, taken along line X-X of FIG. 6A, and FIG. 7B, taken along line the Y-Y of FIG. 6A, illustrate the structure of FIG. 7 after deposition of a dielectric layer 44 on top of etch stop material 43 and a patterned photoresist mask 45 on top of dielectric layer 44. Next the portions of dielectric layer 44 not covered by photoresist masks 45 are etched to create the structure of FIG. 7C, which, like FIG. 7A, is taken along line X-X of FIG. 6A. Next, patterned photoresist mask 45 is removed, and electrical conductor, such as Cu, W, Al, heavily doped polysilicon, and others, is then deposited on the structure of FIG. 7C to fill in the spaces not covered by dielectric layer 44, followed by chemical mechanical processing to create the interlayer conductors 18 shown in FIG. 8. FIG. 8A is a cross-sectional view of a portion of the structure of FIG. 8 corresponding to the view along line X-X of FIG. 6A, that is passing through an interlayer conductor 18.

FIGS. 9A-11 illustrate an alternative to the example of FIGS. 5-8A.

In this example, the process proceeds as follows. FIGS. 9A and 9B are simplified top plan and cross-sectional views of the structure shown in FIG. 5 but without the patterned mask 38. The cross-sectional view of FIG. 9B corresponds to the view along line 5A-5A of FIG. 5, that is passing through contact areas 26 as shown in FIG. 2. FIGS. 9C and 9D are views corresponding to FIGS. 9A and 9B after deposition of dielectric mask material 46, such as silicon nitride. Thereafter, photoresist patterned mask 38 is formed on dielectric mask material 46 as shown in the top plan and cross-sectional views of FIGS. 9E and 9F. This is followed by trimming of photoresist patterned mask 38 to create trimmed photoresist patterned mask 38A as shown in the plan and cross-sectional views of FIGS. 9G and 9H. Thereafter the dielectric mask material 46 not covered by mask 38A is etched and mask 38A is removed resulting in the creation of dielectric mask 39 as shown in the FIGS. 9I and 9J. This is followed by oxidizing the structure of FIGS. 9I and 9J, the result of which is shown in FIGS. 9K and 9L. The oxidizing step causes the upper portions 50 of the exposed electrically conductive layers 12 to oxidize and become electrically nonconducting. As shown in FIG. 9L, this oxidation effectively reduces the height of electrically conductive layers 12 except where extensions 42 of electrically conductive layers 12 are covered by patterned dielectric mask 39. The oxidation process also creates bulges 52 of oxide material overlying the portions 50 of electrically conductive layers 12.

Figure 9M:
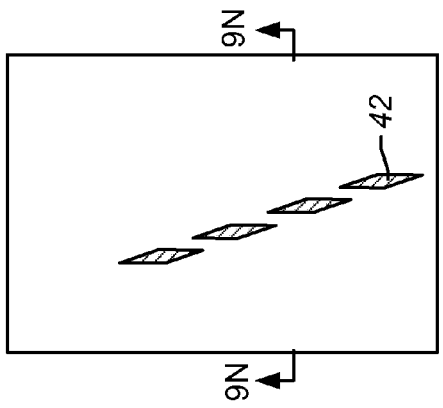
Figure 9N:
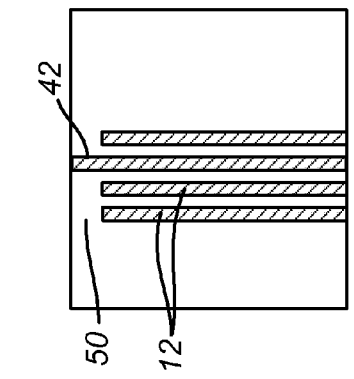
Figure 9P:
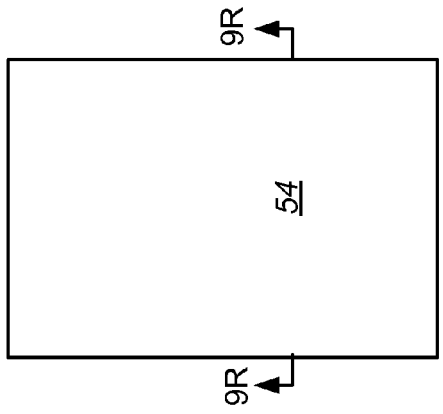
Figure 9Q:
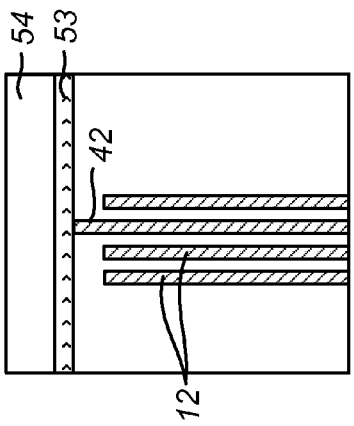
Figure 9R:
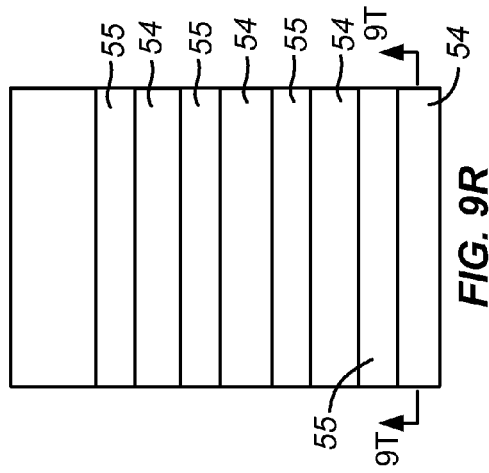
Figure 9S:
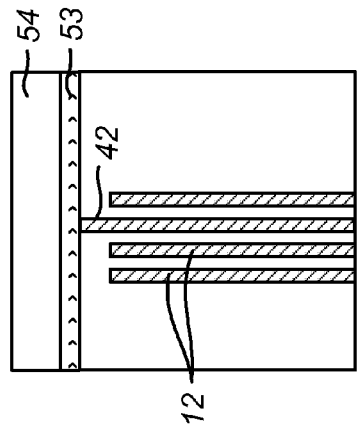
Figure 9O:
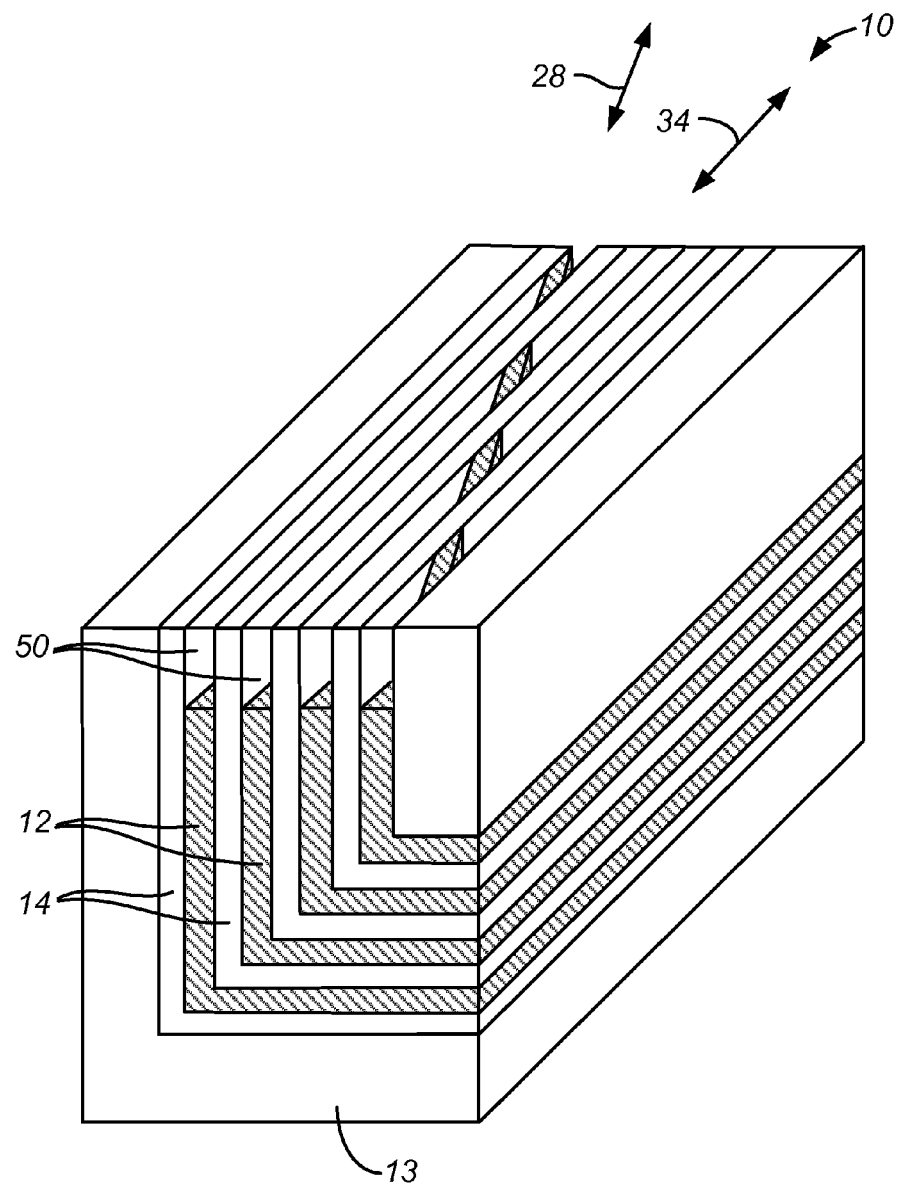
Figure 9T:
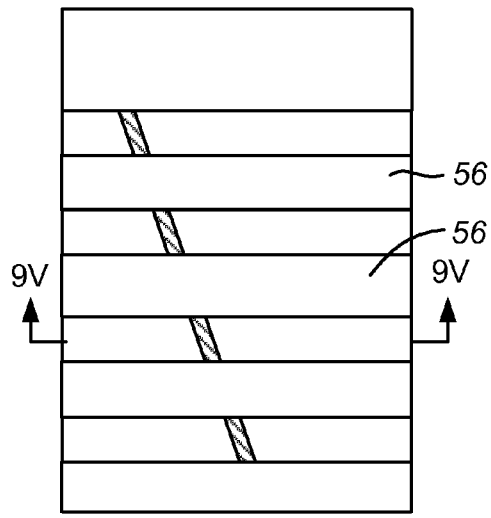
Figure 10A:
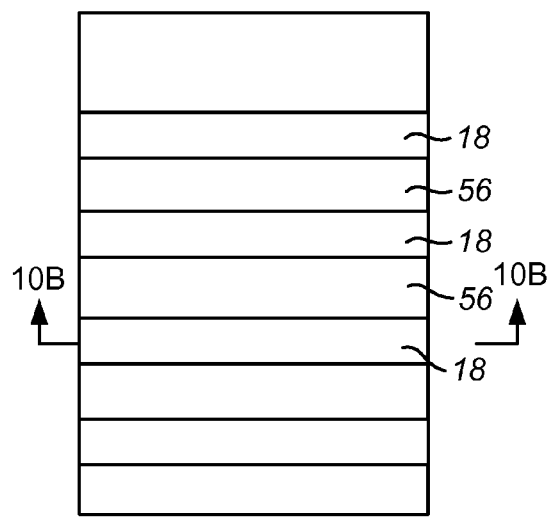
Figure 9U:
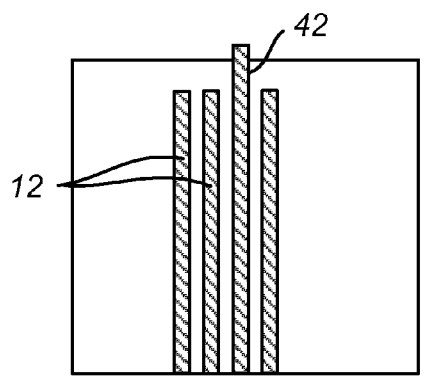
Figure 10B:
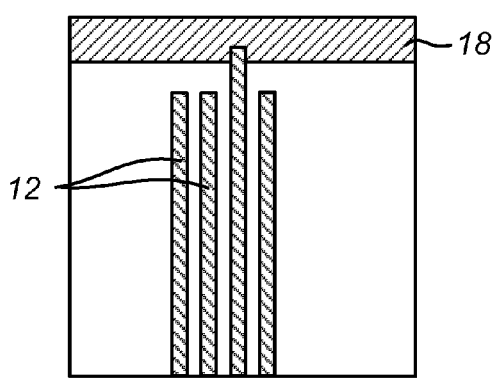
Figure 11:
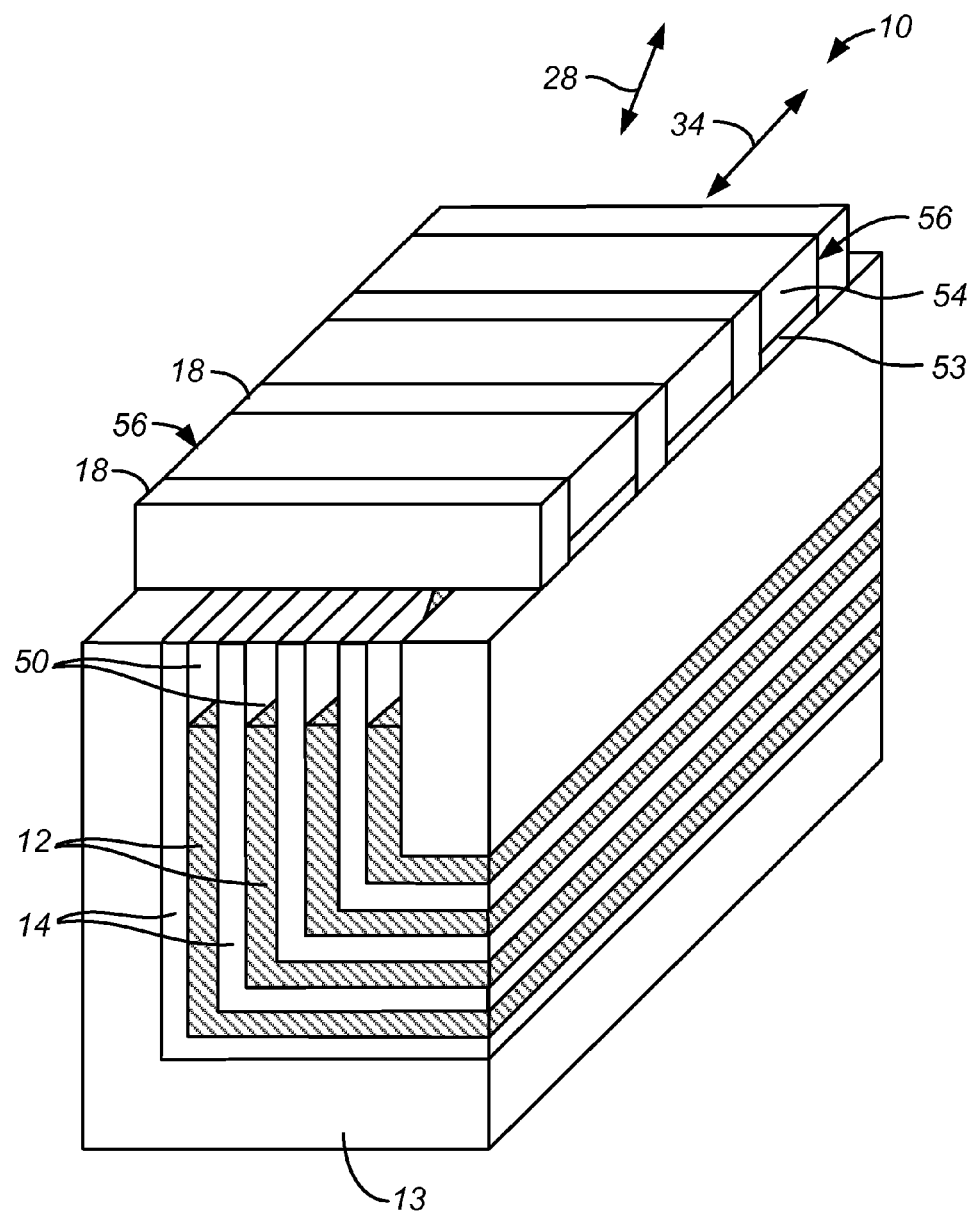

Dielectric mask 39 is removed and the exposed surface is finished using chemical mechanical polishing to create the structure shown in FIGS. 9M, 9N and 9O. This is followed by depositing an etch stop layer 53, typically silicon nitride, on the structure of FIGS. 9M and 9N, followed by depositing a dielectric layer 54, typically $SiO_2$, on etch stop layer 53. This is shown in the plan and cross-sectional views of FIGS. 9P and 9Q. FIG. 9R shows the laterally extending strips of a photoresist patterned mask 55 formed on etch stop layer 53 with laterally extending gaps exposing laterally extending strips of dielectric layer 54. FIG. 9S shows a cross-sectional view taken along line 9S-9S of FIG. 9R. The exposed dielectric layer 54 and the underlying etch stop layer 53 between the laterally extending segments of photoresist patterned mask 55 of FIG. 9R are then etched down to extensions 42 of electrically conductive layers 12 as shown in FIGS. 9T and 9U. This results in laterally extending, spaced apart strips 56 of dielectric material. As is evident from FIG. 11, strips 56 include strips of both dielectric layer 54 and etch stop layer 53. The structure of FIGS. 9T and 9U then has electrically conductive material deposited in the regions between strips 56 followed by chemical mechanical polishing to create interlayer connectors 18 between the strips 56. This is shown in FIGS. 10A, 10B and 11.

FIGS. 12-22 illustrate another method for creating interlayer connectors in contact with electrically conductive layers.

Figure 12:
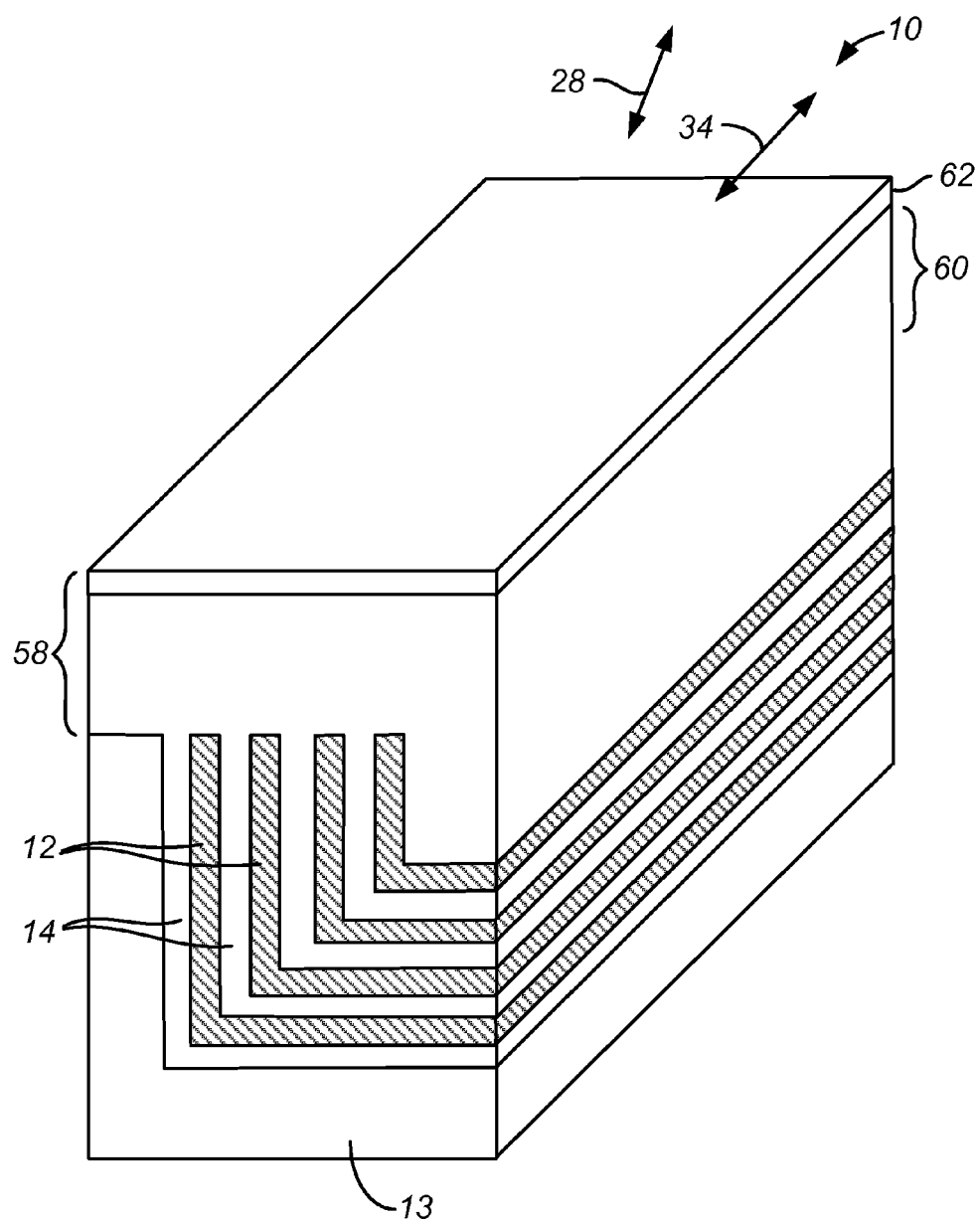

FIG. 12 illustrates the connector access region 10 of an IC device 11 of FIG. 5 after creation of an isolation layer 58 over connector access region 10. Isolation layer 58 includes a dielectric layer 60 over upper surface 16. A hard mask layer 62 is formed over dielectric layer 60. Typical materials for hard mask layer 62 include SiN, SiON, BN, and others.

Figure 13:
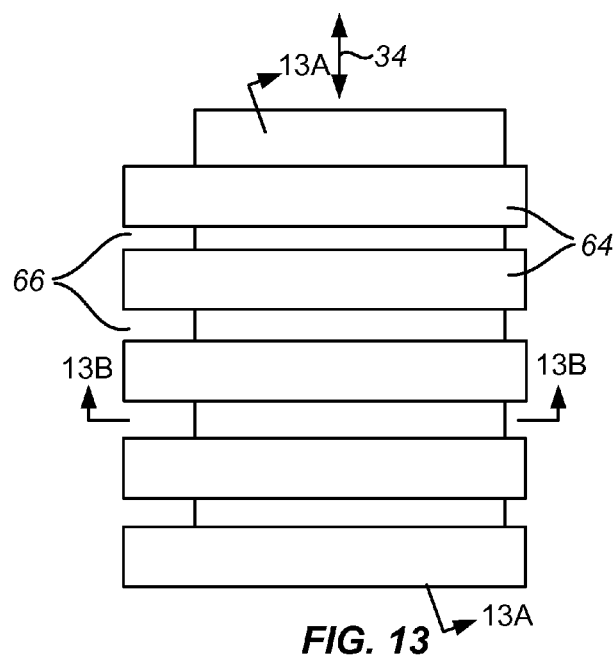

FIG. 13 is a top plan view of the structure of FIG. 12 after creating a patterned photoresist layer 64 on the hard mask layer 62. Patterned photoresist layer 64 defines a series of first gaps 66 oriented perpendicular to the direction of the electrically conductive layers 12, that is perpendicular to first direction 34.

Figure 13A:
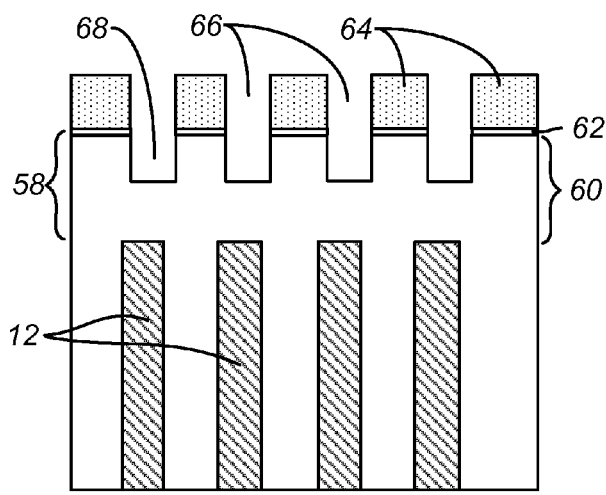
FIG. 13A is a cross-sectional view taken along line 13A-13A of FIG. 13 after etching the structure of FIG. 13 to create trenches at the first gaps in the patterned photoresist layer, the trenches passing through the hard mask layer and part way through the dielectric layer.
Figure 13B:
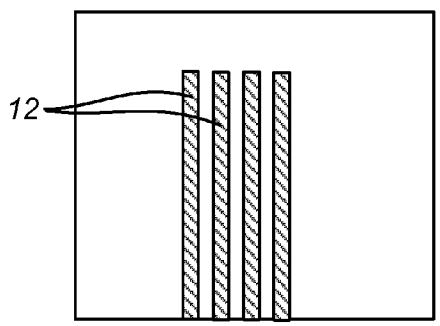
FIG. 13B is a cross-sectional view taken along line 13B-13B of FIG. 13.
Figure 14:
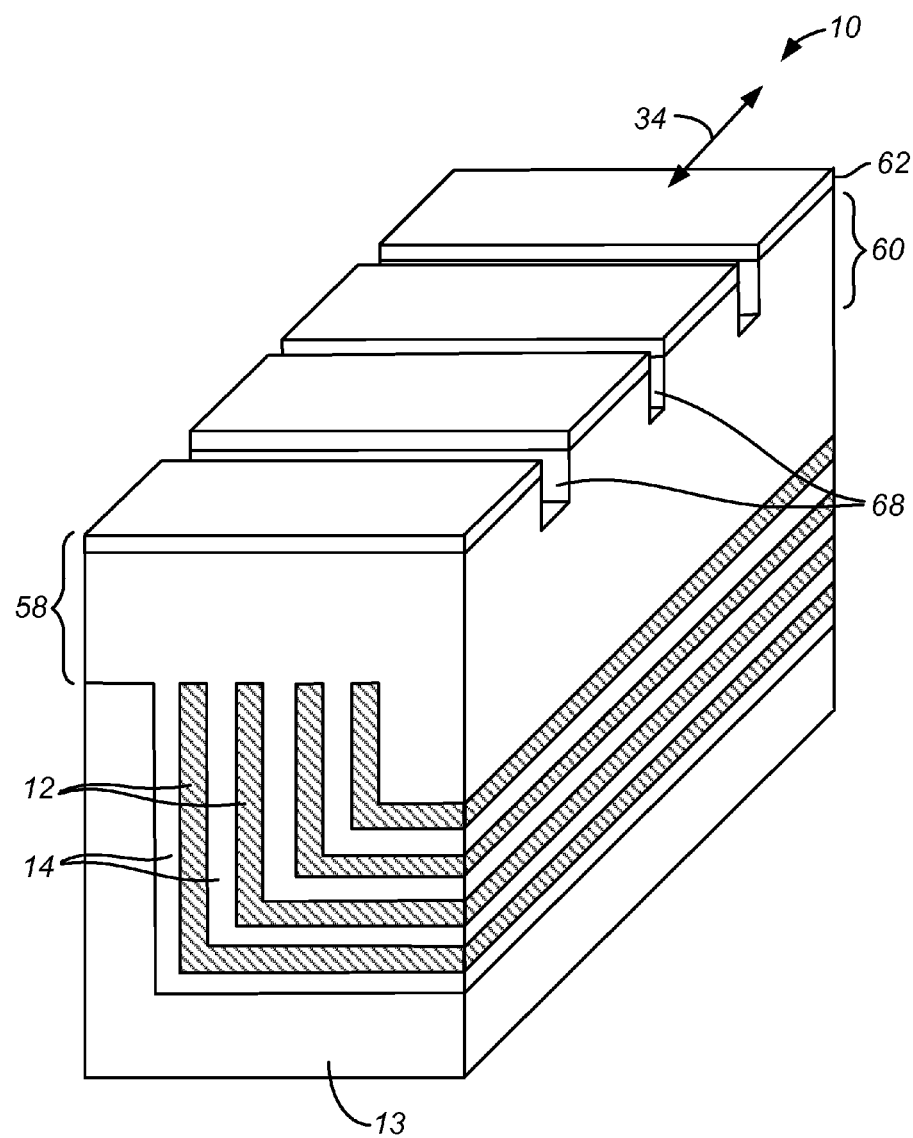

FIG. 13A is a cross-sectional view taken along line 13A-13A of FIG. 13 after etching the structure of FIG. 13 to create first trenches 68 at first gaps 66 in the patterned photoresist layer 64. First trenches 68 pass through hard mask layer 62 and part way through the underlying dielectric layer 60. FIG. 13B is a cross-sectional view of the structure of FIG. 13A taken along line 13B-13B of FIG. 13. FIG. 14 is a three-dimensional view of the structure of FIGS. 13A and 13B after removal of the patterned photoresist layer 64.

Figure 15:
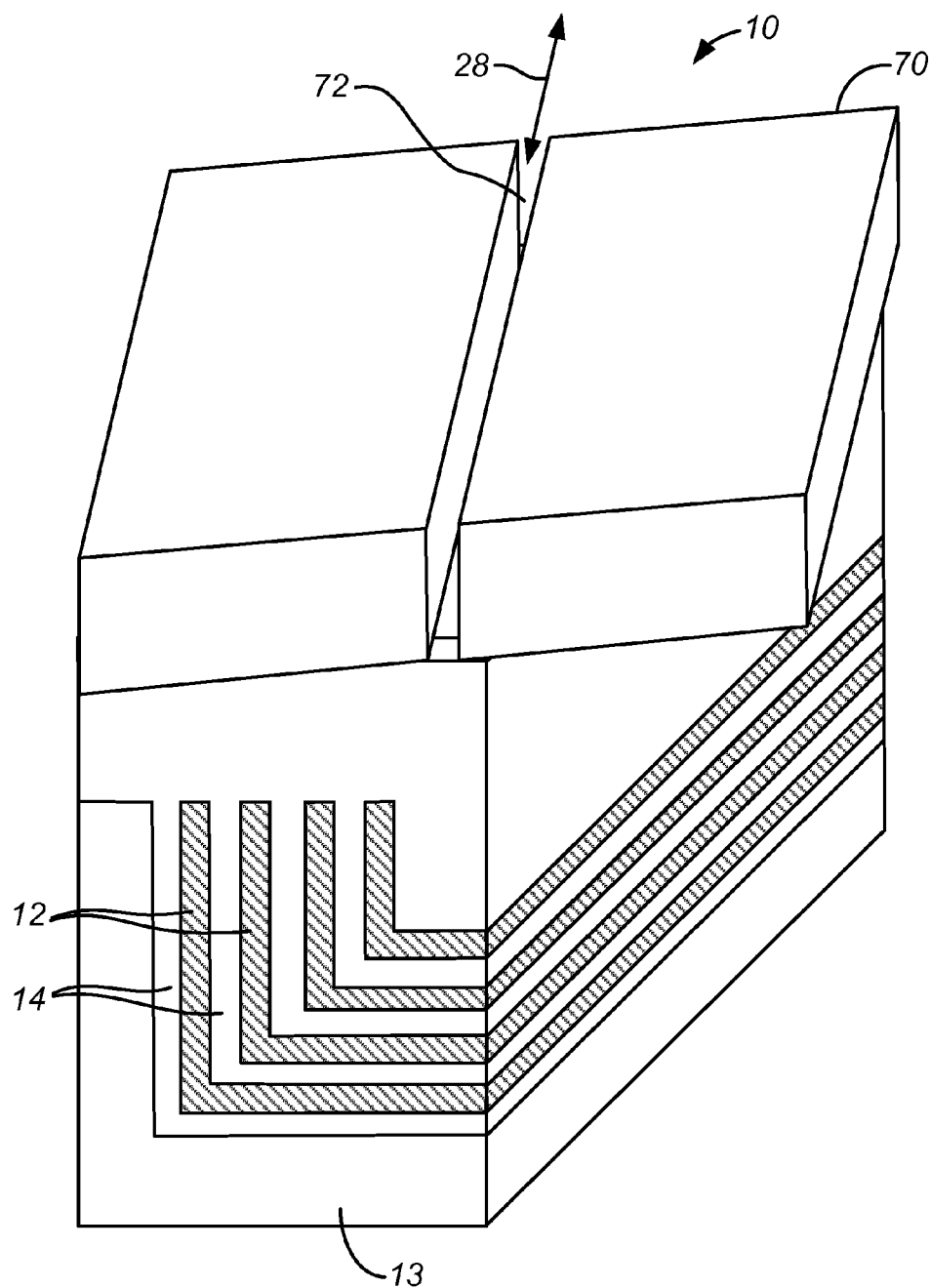
Figure 15A:
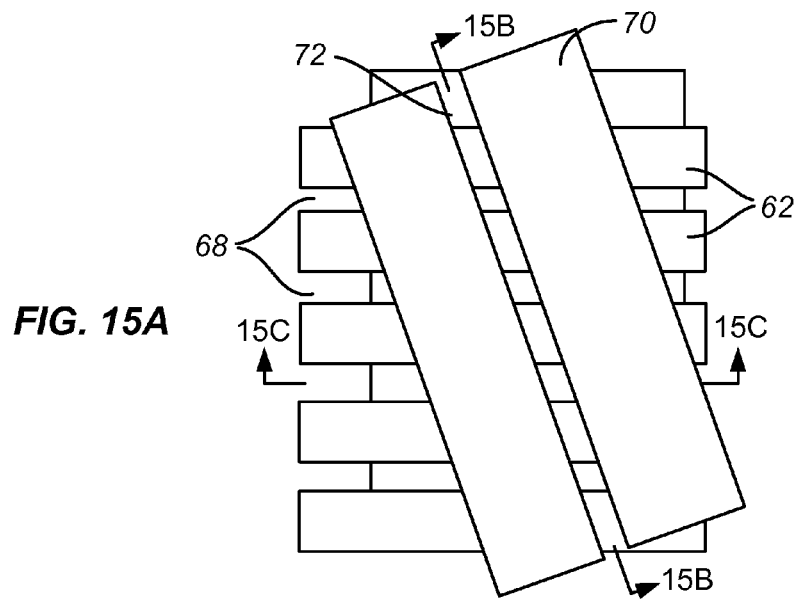
Figure 15B:
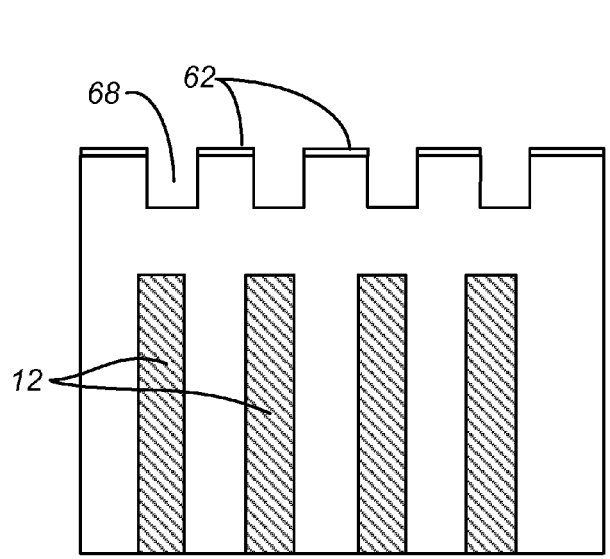
FIGS. 15B and 15C are cross-sectional view taken along lines 15B-15B and 15C-15C of FIG. 15A.
Figure 15C:
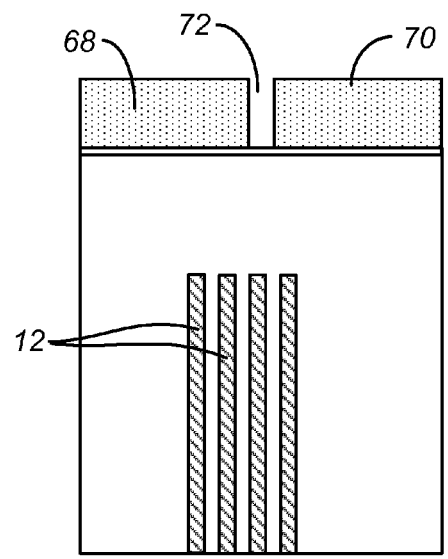

FIGS. 15 and 15A are a three-dimensional view and a reduced-size top plan view of the structure of FIG. 14 showing a second patterned photoresist layer 70 on the hard mask layer 62. Photoresist layer 70 has a second gap 72, the location and orientation of which will define the orientation and location of line 28. As in FIG. 5, the second gap is oriented at an acute angle 36 to the direction 34 of the electrically conductive layers 12 and thus passes over a number of the first trenches 68 in isolation layer 58. FIGS. 15B and 15C are cross-sectional views taken along lines 15B-15B and 15C-15C of FIG. 15A.

Figure 16:
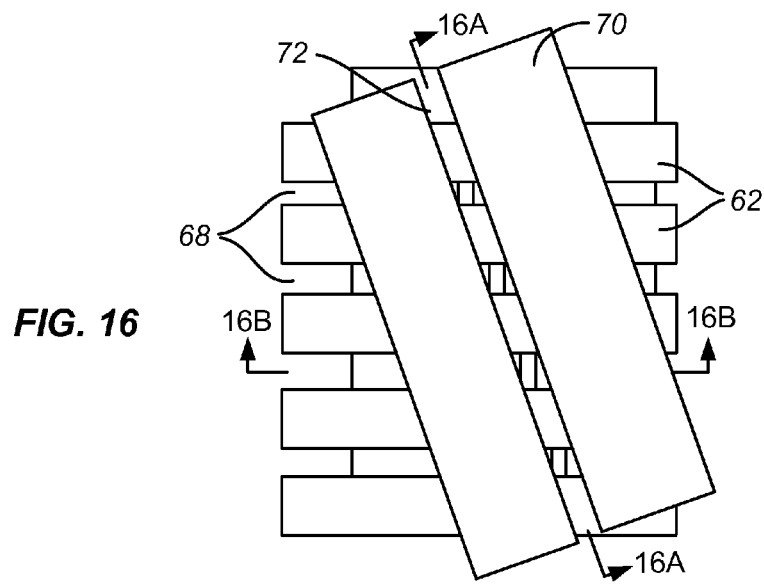
Figure 16A:
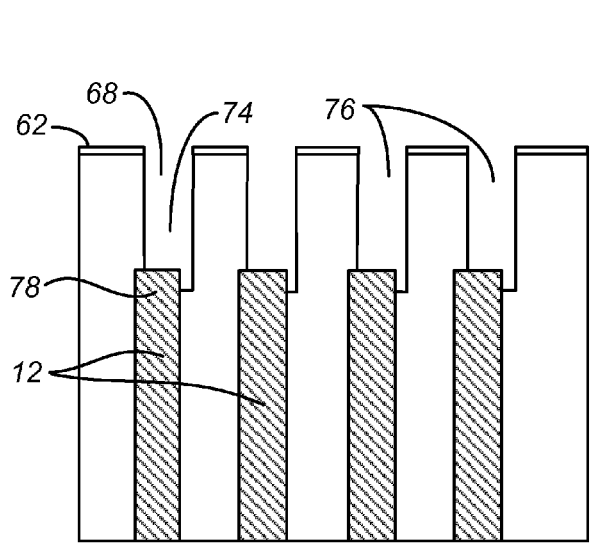
FIGS. 16A and 16B are cross-sectional view taken along lines 16A-16A and 16B-16B of FIG. 16 after etching of the dielectric material exposed by the second gaps defined by the second patterned photoresist layer thereby exposing portions of the upper ends of the electrically conductive layers.
Figure 16B:
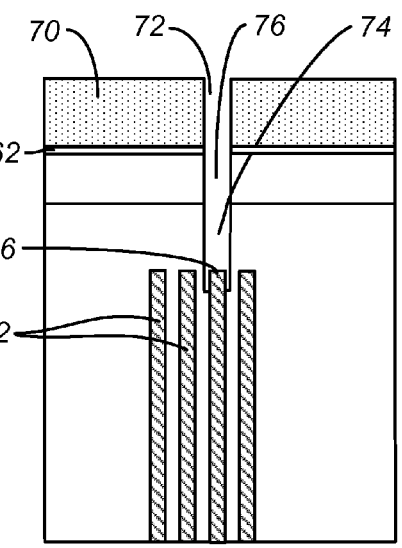

FIG. 16 is a top plan view corresponding to FIG. 15A and FIGS. 16A and 16B are cross-sectional views corresponding to FIGS. 15B and 15C after etching of those portions of the dielectric material of dielectric layer 60. However, unlike the etching step to create first trenches 68, those portions of hard mask layer 62 which are exposed by the second gap 72 of the second patterned photoresist layer 70 are not etched in the step. Doing so creates a second, interrupted trench 74 in dielectric layer 60. Second, interrupted trench 74 exposes segments of the upper ends 78 of the electrically conductive layers 12 at different positions along the electrically conductive layers thus creating contact areas 26. The combination of first trenches 68 and second, interrupted trench 74 creates openings 76 extending from hard mask layer 62 down to contact areas 26.

Figure 17:
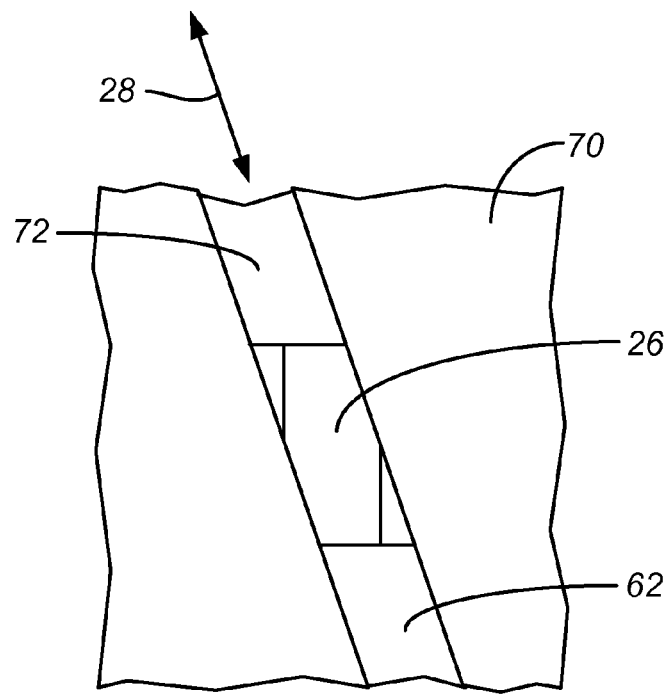
Figure 17A:
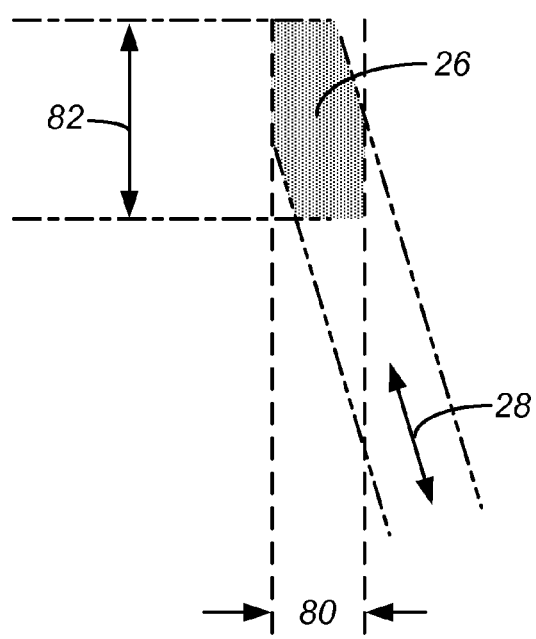

FIGS. 17 and 17A are enlarged views illustrating the generally rectangular shape of an example of a contact area 26 at the upper end of an electrically conductive layer. Contact area 26 is defined primarily by the width 80 of conductive layers 12 and the width 82 of the first trench 68. Width 82 defines the length of contact area 26 while width 80 defines the width of the contact area. In addition, the basic rectangular shape defined by the widths 80, 82 is modified by the width 84 of second, interrupted trench 74 extending along line 28. The particular shape of contact area 26 of FIG. 17 depends on a number of factors including angle 36, widths 80, 82 and the width of second gap 72. As discussed above with reference to FIG. 6, contact areas 26 will typically have rounded corners and sides which are not completely straight due to manufacturing variabilities and constraints.

Figure 18:
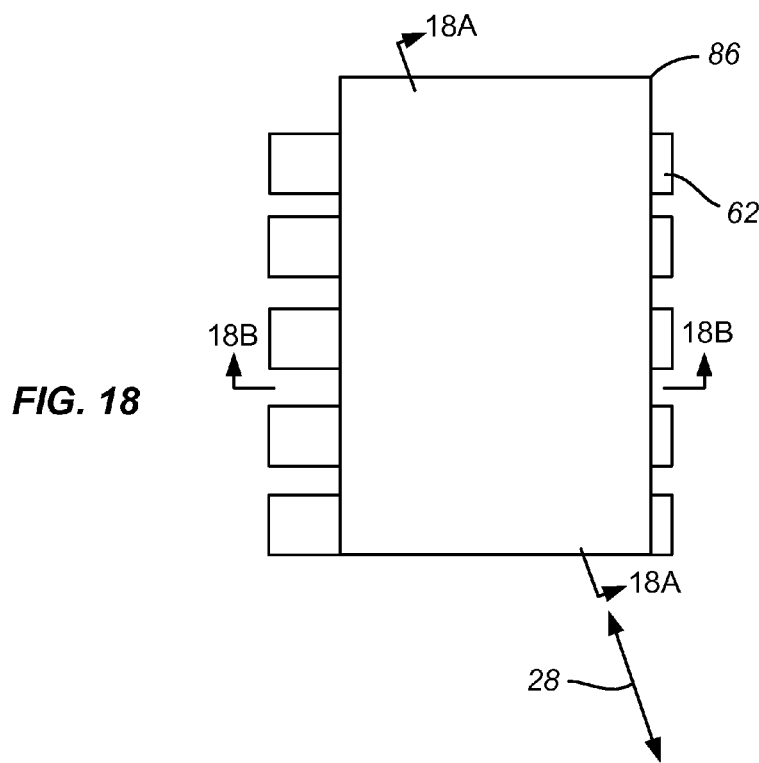
Figure 18A:
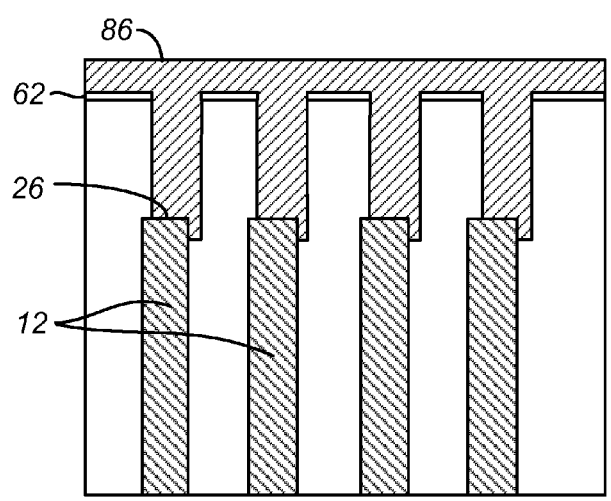
Figure 18B:
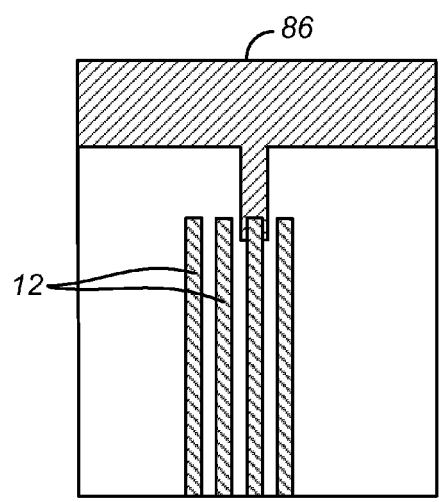

FIGS. 18, 18A and 18B are a top plan view and two cross-sectional views taken along lines 18A-18A and 18B-18B, after removal of second patterned photoresist layer 70 and the deposition of an electrically conductive material 86, such as Cu, W, Al, or heavily doped polysilicon, onto the structure. Doing so results in electrically conductive material 86 covering hard mask layer 62 and filling openings 76. In this way, the electrically conductive material 86 is electrically connected to contact areas 26 of electrically conductive layers 12.

Figure 19A:
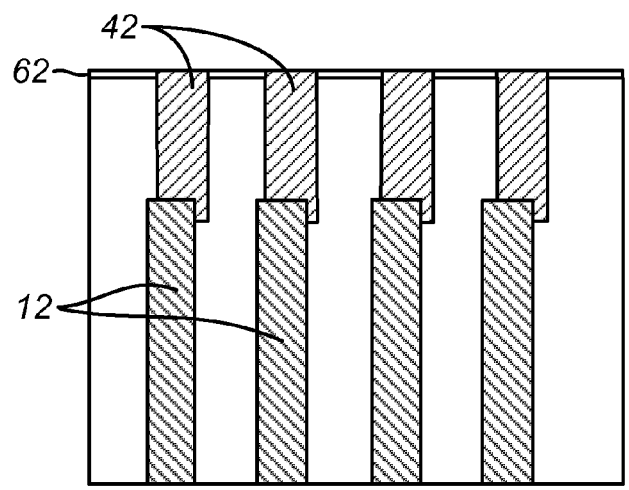
FIGS. 19A and 19B show the structure of FIGS. 18A and 18B following the removal of the electrically conductive material down to the hard mask layer.
Figure 19B:
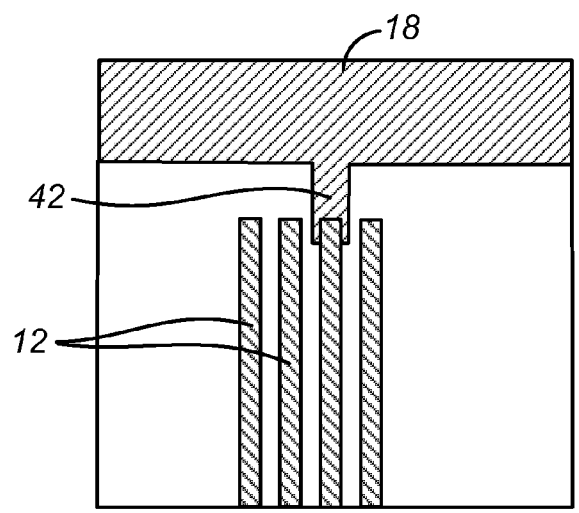
Figure 20:
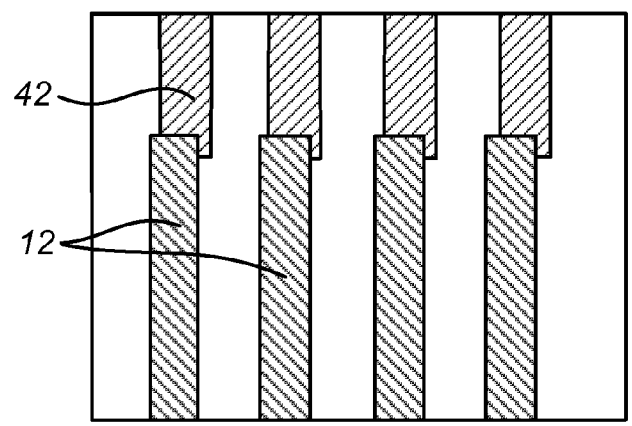

FIGS. 19A and 19B are view similar to FIGS. 18A and 18B and show the structure of FIGS. 18-18B following the removal of the electrically conductive material 86 down to the hard mask layer 62 to create extensions 42 of electrically conductive layers 12 and interlayer connectors 18 electrically connected to the extensions 42. This is typically accomplished by chemical mechanical polishing. FIG. 20 shows the structure of FIGS. 19A and 19B following an optional chemical mechanical polishing step to remove the hard mask layer 62.

Figure 21:
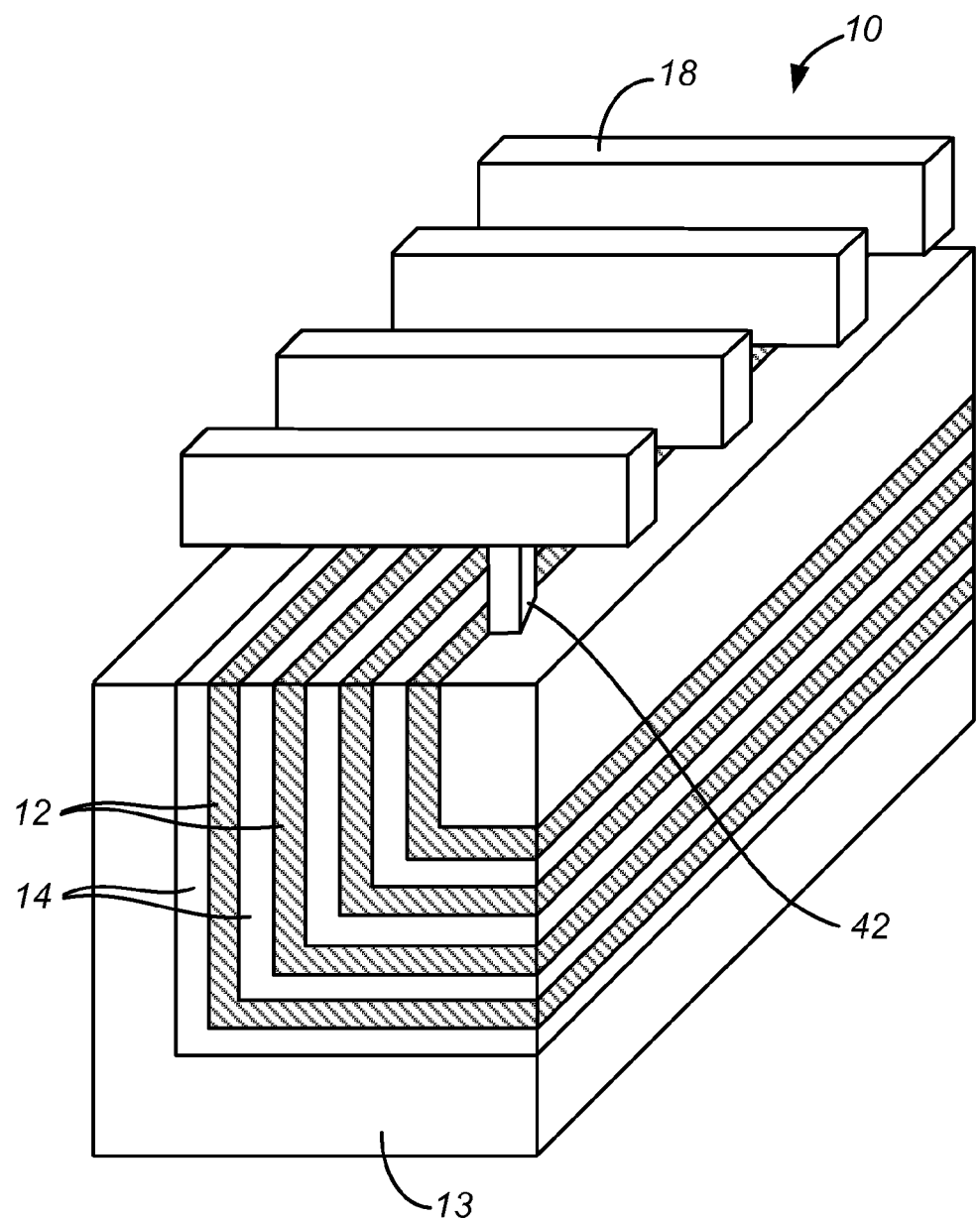
Figure 22:
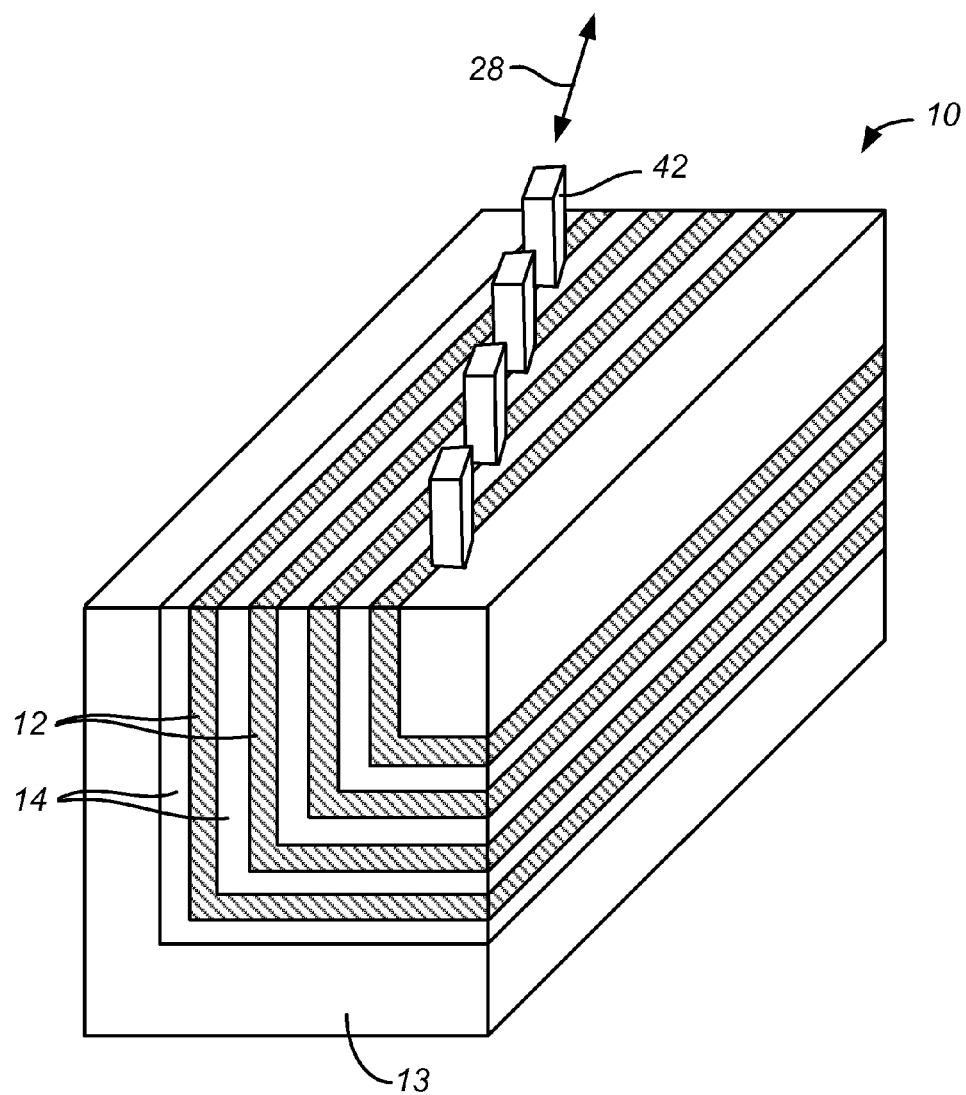

FIG. 21 is a three-dimensional view of the structure of FIG. 20 but with the interlayer dielectric material surrounding extensions 42 and between interlayer connectors 18 removed to show detail. FIG. 22 shows the structure of FIG. 21, again with the interlayer dielectric material removed, but also with the removal of interlayer connectors 18 to show extensions 42 extending along line 28.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A connector access region of an integrated circuit device comprising:
    a set of parallel conductors extending in a first direction;
    the conductors comprising a set of electrically conductive contact areas on different conductors, the contact areas defining a contact plane, the conductors extending below the contact plane;
    the set of contact areas defining a line at an oblique angle to the first direction;
    interlayer connectors in electrical contact with the contact areas, the interlayer connectors extending above the contact plane;

at least some of the interlayer connectors overlying but electrically isolated from the conductors adjacent to the contact areas with which said interlayer connectors are in electrical contact.

2. The connector access region according to claim 1, wherein the set of parallel conductors comprises a set of electrically conductive layers and the contact plane is generally perpendicular to the electrically conductive layers.

3. The connector access region according to claim 2, wherein:
the electrically conductive layers have upper edges generally aligned with the contact plane; and
an electrically insulating material covering said upper edges with the exception of the contact areas.

4. The connector access region according to claim 2, wherein:
the electrically conductive layers have stepped upper edges including said contact areas and recessed regions spaced apart below the contact plane; and
electrically insulating material covering the recessed regions.

5. The connector access region according to claim 1, wherein the oblique angle is less than 45°.

6. The connector access region according to claim 1, wherein the oblique angle is 5° to 27°.

7. The connector access region according to claim 1, wherein at least some of the interlayer connectors are arranged generally perpendicular to the contact plane.

8. The connector access region according to claim 1, wherein the at least some of the interlayer connectors are arranged generally parallel to the contact plane.

9. The connector access region according to claim 1, wherein the contact areas have generally parallelogram shapes.

\* \* \* \* \*